(12) United States Patent
Licitar et al.

(10) Patent No.: US 11,305,343 B2
(45) Date of Patent: Apr. 19, 2022

(54) APPARATUS AND METHOD FOR PROGRAMMING A CRYSTAL LATTICE STRUCTURE OF NANOPARTICLES

(71) Applicant: Nanom Inc., Palo Alto, CA (US)

(72) Inventors: Antonijo Licitar, Zagreb (HR); Jon Armann Steinsson, Gillingham (GB)

(73) Assignee: Nanom Inc., Palo Alto, CA (US)

( * ) Notice: Subject to any disclaimer, the term of this patent is extended or adjusted under 35 U.S.C. 154(b) by 248 days.

(21) Appl. No.: 16/289,244

(22) Filed: Feb. 28, 2019

(65) Prior Publication Data

US 2019/0299282 A1 Oct. 3, 2019

Related U.S. Application Data

(60) Provisional application No. 62/636,791, filed on Feb. 28, 2018.

(51) Int. Cl.
*B22F 1/00* (2006.01)
*B24C 1/04* (2006.01)
(Continued)

(52) U.S. Cl.
CPC ............ *B22F 1/0081* (2013.01); *B24C 1/045* (2013.01); *B82Y 40/00* (2013.01); *C30B 35/007* (2013.01);
(Continued)

(58) Field of Classification Search
CPC ........ B22F 1/0081; B22F 3/087; B22F 3/093; B22F 2304/05; B24C 1/045; B82Y 40/00;
(Continued)

(56) References Cited

U.S. PATENT DOCUMENTS

| | | |
|---|---|---|
| 5,009,371 A | 4/1991 | Nickel |
| 5,411,215 A | 5/1995 | Rouse |

(Continued)

FOREIGN PATENT DOCUMENTS

| | | |
|---|---|---|
| DE | 4322757.0 C1 | 7/1994 |
| EP | 1790615 A1 | 5/2007 |

(Continued)

OTHER PUBLICATIONS

Herceg, Z., et al. "Tribomechanical micronization and activation of whey protein concentrate and zeolite." Sadhana 29.1 (2004): 13-26. (Year: 2004).*

(Continued)

*Primary Examiner* — Robert J Eom
(74) *Attorney, Agent, or Firm* — MLO, a professional corp.

(57) ABSTRACT

Certain aspects of the technology disclosed herein include an apparatus and method for programming a crystal lattice structure of a nanoparticle. A particle programming apparatus can include an input channel connected a particle sampling system. The particle sampling system can direct freshly milled nanoparticles to the particle programming apparatus if the nanoparticles are determined to be below a threshold size. The particle programming apparatus can include one or more programming devices configured to alter a crystal lattice of the received nanoparticles including an ultrasonic sound generator, a magnetic pulse generator, and a voltage generator. The one or more programming devices applies any of a sound, magnetic pulse, and voltage to the received nanoparticles within a time threshold of receiving the nanoparticles from the mill core.

18 Claims, 18 Drawing Sheets

(51) Int. Cl.
  *B82Y 40/00* (2011.01)
  *B22F 3/093* (2006.01)
  *B22F 3/087* (2006.01)
  *B82Y 35/00* (2011.01)
  *B82Y 30/00* (2011.01)
  *G21K 5/04* (2006.01)
  *H01S 3/00* (2006.01)
  *C30B 35/00* (2006.01)
  *G01N 27/00* (2006.01)
  *G01R 33/00* (2006.01)

(52) U.S. Cl.
  CPC ............... G21K 5/04 (2013.01); H01S 3/00 (2013.01); *B22F 3/087* (2013.01); *B22F 3/093* (2013.01); *B22F 2304/05* (2013.01); *B82Y 30/00* (2013.01); *B82Y 35/00* (2013.01); *G01N 27/002* (2013.01); *G01N 27/005* (2013.01); *G01N 27/007* (2013.01); *G01R 33/0005* (2013.01)

(58) Field of Classification Search
  CPC ....... B82Y 30/00; B82Y 35/00; C30B 35/007; G21K 5/04; H01S 3/00; G01N 27/002; G01N 27/005; G01N 27/007; G01R 33/0005
  See application file for complete search history.

(56) References Cited

U.S. PATENT DOCUMENTS

| | | | |
|---|---|---|---|
| 6,600,559 | B2 | 7/2003 | Switalski et al. |
| 7,441,717 | B1 | 10/2008 | Majka et al. |
| 2005/0253000 | A1 | 11/2005 | Krause et al. |
| 2008/0185463 | A1 | 8/2008 | Schlesinger et al. |
| 2009/0084874 | A1 | 4/2009 | Alam et al. |
| 2010/0155310 | A1 | 6/2010 | Enomura |
| 2014/0284407 | A1 | 9/2014 | Tamper et al. |

FOREIGN PATENT DOCUMENTS

| | | |
|---|---|---|
| EP | 2184109 A1 | 5/2010 |
| GB | 2130119 A1 | 12/1972 |
| JP | 6019102 B2 | 10/2016 |
| WO | 0064586 A1 | 11/2000 |
| WO | 2010055199 A1 | 5/2010 |

OTHER PUBLICATIONS

Henderson, Hunter B., et al. "Magneto-Acoustic Mixing Technology: A Novel Method of Processing Metal-Matrix Nanocomposites." Advanced Engineering Materials 16.9 (2014): 1078-1082. (Year: 2014).*

European Search Report dated Oct. 28, 2020 for European Patent Application No. 18756986.8, 8 pages.

"Particle Size Analyzers," Shimadzu, retrieved Apr. 24, 2020, 20 pages.

"Precipitated Calcium Carbonate," 2020 Minerals Technologies Inc., retrieved Apr. 24, 2020, 7 pages.

* cited by examiner

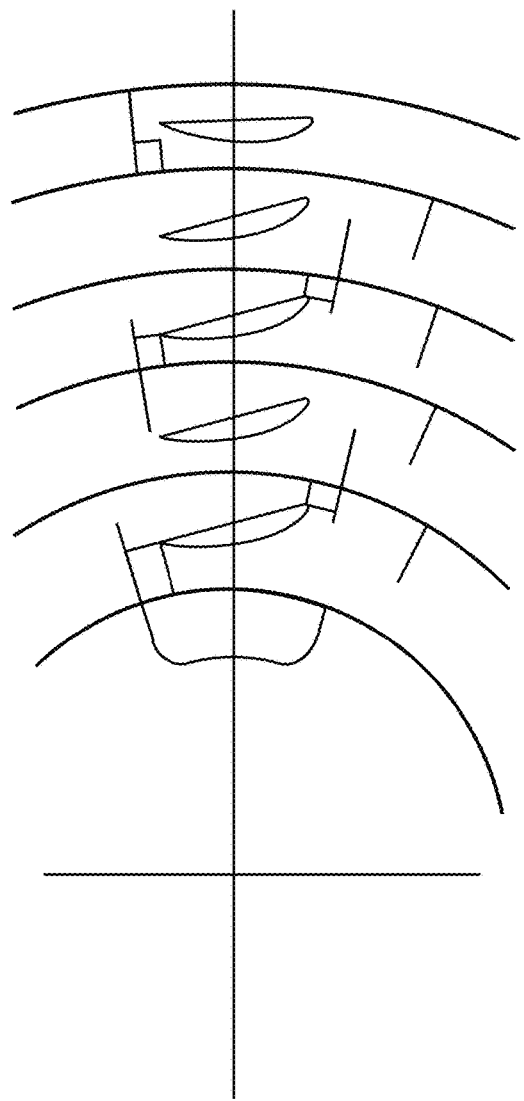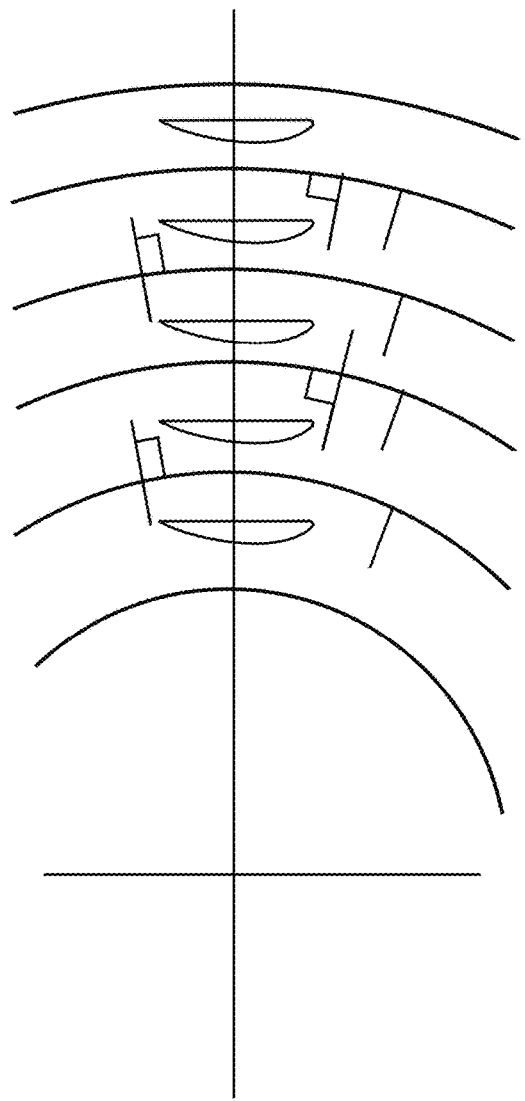
*FIG. 8*  *FIG. 9*

APPARATUS AND METHOD FOR PROGRAMMING A CRYSTAL LATTICE STRUCTURE OF NANOPARTICLES

CROSS-REFERENCE TO RELATED APPLICATION

This application claims the benefit of U.S. Provisional Application No. 62/636,791, titled "Apparatus and Method for Programming a Crystal Lattice Structure of Nanoparticles" and filed on Feb. 28, 2018, which is incorporated herein by reference in its entirety.

This application is related to U.S. application Ser. No. 15/712,856, titled "Apparatus and Method for Forming Nanoparticles" and filed on Sep. 22, 2017, which claims priority to U.S. Provisional Application No. 62/463,518, titled "Apparatus and Method for Forming Nanoparticles and Applications Thereof" and filed on Feb. 24, 2017, each of which is incorporated herein by reference in its entirety.

TECHNICAL FIELD

The present application is related to nanoparticles, and more specifically to an apparatus and method for programming a crystal lattice structure of one or more nanoparticles.

BACKGROUND

A particle is a minute fragment or quantity of matter having physical and/or chemical properties. Particles can be classified according to diameter. Nanoparticles are generally between 1 and 100 nanometers in size, fine particles are sized between 100 and 2,500 nanometers, and coarse particles cover a range between 2,500 and 10,000 nanometers. Properties of a material can change as their size approaches the nanoscale because the percentage of the surface in relation to the percentage of the volume of the material becomes significant. For coarse particles, the percentage of the surface is typically insignificant in relation to the volume in the bulk of the material. However, nanoparticles can have a high surface area to volume ratio where forces resulting from the high surface area dominate contributions to the nanoparticle's physical and/or chemical properties. Conventional monolith nanoparticles are sphere shaped and have a small active surface. Conventional nanoparticles tend to homogenize in small clusters that can easily become bonded. Conventional nanoparticles are unsuitable for high volume commercial production.

Conventional methods to manufacture nanomaterial composites, also known as synthetic nanoparticles, are both time and energy consuming even for small volume output. The methods rely on high volume of energy, or complicated chemical procedures and processes such as solvent extraction, spray drying, nano-precipitation, evaporation, and emulsion photo-crosslinking. Conventional methods typically require multi-step procedures and often result in a wide distribution of particle sizes and a low reaction yield.

Conventional particle grinding methods include Tribomechanical Micronization and Activation (TMA). TMA has rotors and multiple aerodynamic vanes that physically grind particles. The method produces micro to macro size pulver and cannot mill hard materials. This method is known to suffer "wear and tear" problems and TMA rotors have to be replaced regularly, even many times a day during the milling process. Since TMA involves rotors physically contacting particles, output particles include residue and impurities from the rotors.

SUMMARY

Embodiments of the disclosed technology include a particle programming apparatus configured to alter a crystal lattice structure of a nanoparticle. The particle programming apparatus can include an input channel connected a particle sampling system. The particle sampling system can direct freshly milled nanoparticles to the particle programming apparatus if the nanoparticles are determined to be below a threshold size. The particle programming apparatus can include one or more programming devices (e.g., an array of devices) configured to alter a crystal lattice of the received nanoparticles including an ultrasonic sound generator, a magnetic pulse generator, and a voltage generator. The one or more programming devices can apply any of a sound, magnetic pulse, and voltage to the received nanoparticles within a time threshold of receiving the nanoparticles from the mill core. Applying any of a sound, magnetic pulse, and voltage to the received nanoparticles within the time threshold can ensure that a crystal lattice structure of the received nanoparticles is programmed prior to hardening.

Embodiments of the technology disclosed herein include methods to form substantially pure nanoparticles without requiring contact with a rotor. A nanomill including an aerodynamic vane can direct nanoparticles to a collision region without colliding with the nanoparticles. The nanomill can mass producing monolith and composite nanomaterial from various materials including, for example, metal, minerals, and bio-material.

The nanomill can be configured to process material in a plurality of phases including, for example, a milling phase, optical sensory phase, particle sampling phase, particle separation phase, particle programming phase, particle solidifying phase, particle storage phase, particle packing phase, or any combination thereof. The plurality of phases can be managed and coordinated by one or more electronic control units.

The nanomill can comprise a material input hopper, a core also referred to as Rotor Chamber, Gas Tank for Atmosphere Control, Blower, Optical Sensor Array, Particle Sampling Array, Particle Separator Array, Membrane, Particle Storage Unit, Particle Programming Array, also referred to as Frequency Adjuster, Particle Solidifying Chamber, Compression Tank, Compressor, Drain Valve, Sampling Valve, Control Unit(s), Production Exit Point also referred to as Particle Packaging Unit.

The nanomill can include and/or operate inside of an atmospheric controlled chamber to regulate the exposure and influence of oxygen, humidity, temperature, bar pressure, sound, and luminous energy on material during and/or after processing. In another embodiment, the nanomill can operate in a unregulated environment regardless of the influence of oxygen, humidity, temperature, bar pressure, and luminous energy.

BRIEF DESCRIPTION OF THE DRAWINGS

FIG. 8 shows a cross-sectional top view of aerodynamic vanes having a tilt angle, according to an embodiment.

FIG. 9 shows a cross-sectional top view of aerodynamic vane having a tilt angle, according to an embodiment.

DETAILED DESCRIPTION

Figure 1:
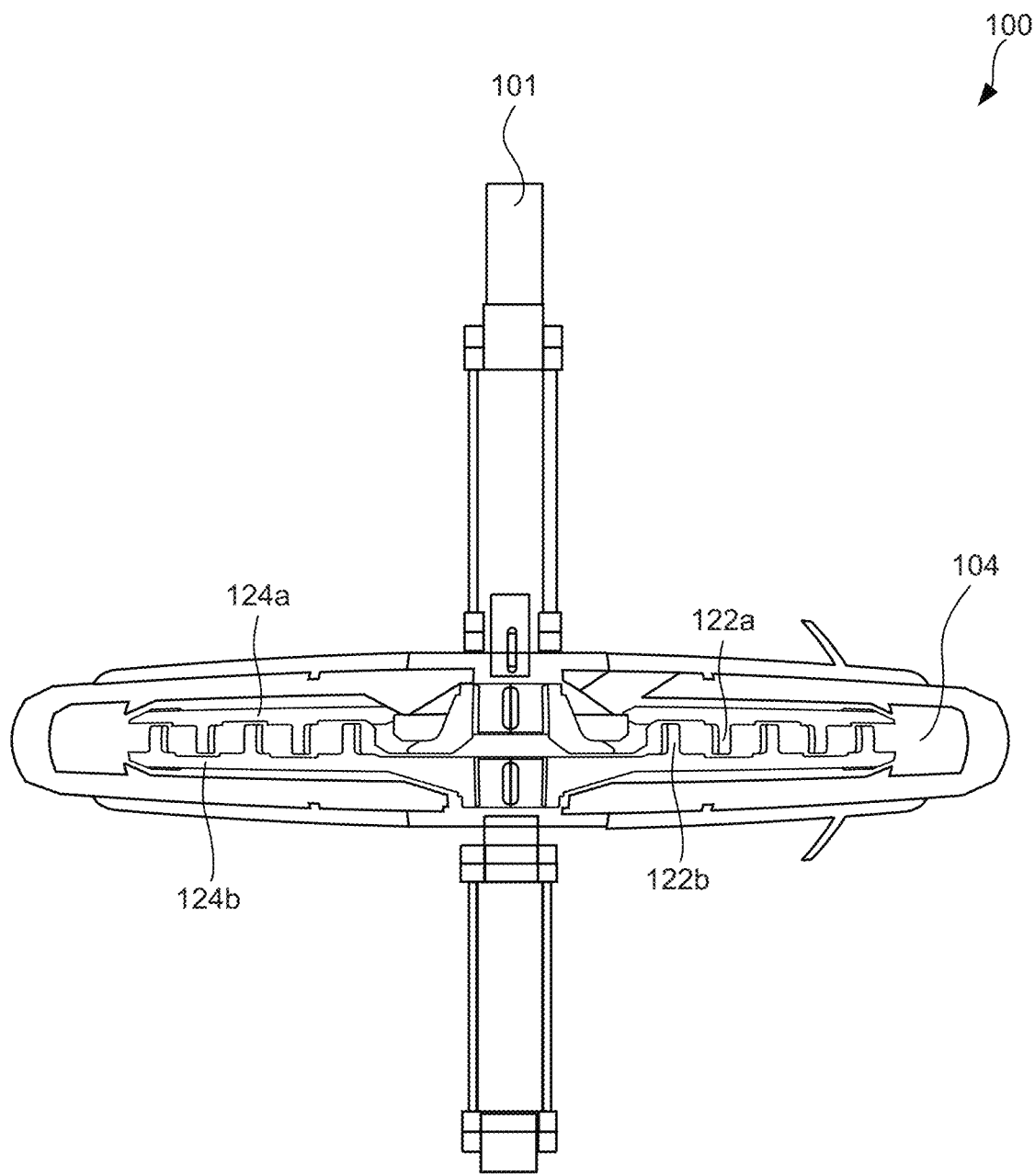
FIG. 1 shows a cross-sectional side view of a nanoparticle mill, according to an embodiment.

The size and shape of nanoparticles are the most important parameters that define the properties of a given nanomaterial. Nanoparticles below 30 nanometers (nm) in size have an excess of energy at the surface and are thermodynamically unstable because of tension on their boundaries that is acting as a driving force, which leads to a spontaneous reduction of the surface area. A particle size of 30 nm is the critical size of nanoparticles below which they exhibit their typical "nano" properties in comparison with the same properties for bulk material. There is an exponential increase of the amount of molecules present at the particle's surface when the size of a nanoparticle decreases.

The chemical properties of a nanomaterial, such as its surface chemistry, photocatalytic properties, etc., depend on the dynamics of its electrons. Nanoparticles of different sizes, shapes, and chemical types contribute to many different chemical properties. Metallic nanoparticles are the most flexible nanostructures. Thus, an entity can more easily control the size, shape, composition, structure, assembly, encapsulation, and optical properties of metallic nanoparticles than other nanoparticles.

The properties of nanoparticles are determined by their structure. On the other hand, the structure depends on the process of their formation or the process of their manipulation, modification, or programming of the nanoparticles.

It is very important to retain high purity in nanoparticles. The milling technology of nanoparticle production described herein was designed to produce nanoparticles that have a desired composition without impurities, suitable for surface modification, and reproducible functionality.

The properties of nanoparticles change drastically with relatively minor differences in the size and/or number of atoms because of their electron configurations and corresponding structure of energy states. A spinning electron within the nanoparticle can be aligned in a certain direction by applying an external magnetic field or modulated magnetic pulse. This opens up a possibility of modifying nanoparticles across a distance by applying external magnetic field(s). Moreover, this can be performed in concert with other types of nanoparticle modification, for example, by sound, magnetic interference, external changes in electric potential, etc.

Magnetic properties depend primarily on particle size within the nanometer range. The magnetic behavior of nanoparticles, however, depends on their chemical composition and size, as well as their crystalline modification and structural defects, if any. The method of nanoparticle processing described herein can form magnetic nanoparticles with differences in crystalline structure, surface chemistry, shape, and so on.

There is also dependence of magnetic domain structure inside nanoparticle relative to the particle size. If the size decreases below a critical value, the formation of magnetic domain walls becomes energetically unfavorable and the ferromagnetic particle may only be able to support a single domain. The critical value depend on the kind of material, and the critical value is generally on the order of tens of nanometers.

Thus, magnetic particles of nanometer size usually have a single domain. Typically, magnetic nanoparticles are single-domain magnets. The response of a single-domain particle to the applied magnetic field crucially depends on the direction of the applied field. An important application of this fact is when the nanoparticles are dispersed in liquid. In such a state or configuration, the potential energy of the entire system can be considerably decreased by aligning their characteristic axis of magnetization along the external field (e.g., that is energetically favorable and aligns with the crystallographic direction inside the lattice).

In magnetic nanoparticles, magnetic anisotropies arise from a coupling of the electron spins to the electron orbit which, in turn, is coupled to the crystal lattice. This kind of anisotropy is independent of particle shape and depends on the kind of material. There is another source of anisotropy in magnetic nanoparticles that depends on the shape of the nanoparticles. If a particle has a preferred axis (e.g., being elongated), the preferential orientation of magnetization can be aligned with the preferred axis.

Regarding the electrical properties of nanoparticles and of all types of arrangements built from nanoparticles, the most important property is the amount of energy required to add one extra electron to an initially uncharged particle. The energy—the so-called "charging energy"—scaled roughly with 1/d, where d is the characteristic dimension of the nanoparticle.

If one exposes the metallic nanoparticle to some incident electromagnetic radiation, alternating electric fields of the external electromagnetic waves will affect the electron clouds that will be enabled to oscillate with respect to the cationic grid, leading to periodic oscillations of charge density at a resonant frequency—the so-called "plasma frequency." Most metals have this frequency in the ultraviolet regime, while some metals, such as copper, exhibit a visible plasma frequency. This fact is important in view of potential particle programming and particle sampling by electromagnetic waves. The quasi-particle or quantum of energy resulting from quantized plasma oscillations is called "plasmon." There are potential interactions between plasma oscillations in the lattice and vibrations of the lattice as a whole (with so called phonons as their corresponding quanta) that is interesting in view of the combining electromagnetic-sound particle programming.

Below 100 nm, electronic behavior of metal nanoparticles changes drastically because of the increased surface-to-volume ratio. The system boundaries become very important in contrast to their bulk counterpart. For smaller metallic nanoparticles (e.g., those less than 2 nm) or clusters, the quantum effects become dominant. For larger metallic nanoparticles (e.g., those greater than 2 nm), free electrons are geometrically confined in a finite small volume of nanoscale, which is much smaller than the wavelength of incident light. Because of that, electrons in the same nanoparticle see almost electric field from the incident radiation. This induces the collective oscillation of negative charges coherently in response to the electric field of the incident light (also referred to as "localized surface plasmon excitation"). The mobile electronics are displaced out of the cationic network, resulting in excess negative charges on one side of the particle surface. They tend to be pulled back under the restoring force due to charge redistribution (electric polarization). Because of the small size of the nanoparticle, the emergence of different polarity on opposite sites forms an effective electric dipole imposed on the displaced electrons, which is different from the free plasmons occurring in the bulk metals. Such electric-dipole excitations interact strongly with the incident electromagnetic waves.

Regarding the equilibrium shape of metallic nanoparticles, that is relevant for nanoparticle programming, minimizing the surface energy of a nanoparticle and maximizing the bonding between its atoms, it may adopt a structure different from that characteristic of bulk metals. Decreasing its size may result in loss of bulk (crystal) lattice structure or amorphization. Relaxation of a metal nanoparticle to its equilibrium shape requires substantial activation energy. By employing the process of particle programming as described herein, the nanoparticle structure can be designed in a short period of time prior to its hardening or attaining its equilibrium state.

Directed electromagnetic pulse can excite a metal nanoparticle to absorb its energy. That energy is first conveyed to the conduction electrons, so the electron-electron interactions (collisions) occur within some tens of femtoseconds. The hot electrons can then heat up the lattice of nanoparticle, and some 10 picoseconds later (e.g., for a 10 nm nanoparticle) the whole nanoparticle cools down to the ambient temperature via heat diffusion. Heating of the electron gas has mechanical effects so that, effectively, an optical excitation (photons) launches elastic oscillations (phonons).

As the energy of electrons transfers to lattice modes (e.g., generally on a timescale of picoseconds), anharmonicity causes thermal expansion. For large enough particles, the characteristic time interval is short compared to the period of elastic vibrations (e.g., approximately 3 picoseconds for oscillating of a 10-nm nanoparticle). The elastic oscillations caused in a nanoparticle by a short electromagnetic pulse can be detected in optical range detectable through a periodic redshift of the plasmon resonance. Laser-induced acoustic vibrations of nanoparticles are of particular interest in terms of nanoparticle programming in the optical range.

Surface area to volume ratio for nanoparticles can increase by a factor of 10 as the diameter decreases from the micrometer to nanometer scale. This has significant implications for their thermal conductivity. For example, smaller nanoparticles will have higher thermal conductivity when placed in a fluid (also referred to as a "nanofluid") because of their enhanced surface area. Heat transfer between the fluid and the nanoparticles takes place at their surface. Thermal conductivity of nanoparticles may also be enhanced due to the concentration of water molecules near their surface and by the vibration of their lattice. So, by properly programming nanoparticles, their thermal conductivity can be enhanced.

Modes of lattice vibrations have their eigenfrequencies. These frequencies can be derived/calculated for given conditions in nanoparticle (i.e., surface relaxation) local clamping, shape, etc. Particularly, the surface relaxation and the local clamping are responsible for the specific heat of a nanoparticle. As mentioned above, these may be related to enhancement of the surface structure of the nanoparticle.

One aspect of dynamical properties of nanoparticles that is particularly important for design of particle programming procedures (e.g., type of signal) is the fact that the vibrational modes cannot be separated simply into a transverse mode and a longitudinal mode. Generally, the relevant physical quantity which satisfies the proper wave equation here is potential, not the displacement. In the case of metal particles, the properties of the original metal may already be lost at the scale of 50 nm and less up to 1 nm. That is, the scale range that is most interesting in terms of particle programming.

Accumulations of atoms in nanoparticles after the hardening process, when they are no longer under the influence of the ambient bulk matter, are getting their own behavior that is influenced by their own surrounding and their own natural conditions. The process of (re)programming is going to finish their own structuring given the input from programming device(s).

If a metal particle, initially having bulk properties, is reduced in size down to a few hundred or dozen atoms, the density of states in the valence and conduction bands decreases and the electronic properties change drastically. The conductivity, collective magnetism, and optical plasmon resonance may vanish, and the quasi-continuous density of states may be replaced by quantized levels. The technology described herein may not necessarily go to the level of dozens of atoms. This is not necessarily needed for current applications of the technology, where the larger concern is material structures that are at higher-scale levels.

Physical shape and the surface structure of a nanoparticle are closely related to its own physical and/or chemical properties (e.g., the particle electrostatic potential, magnetic field strength or magnetization, the resonant frequency of the particle lattice, etc.). The shape of a nanoparticle is related to physical conditions within the crystal lattice, such as potential energy, polarity, magnetic dynamics, electrical potential, vibrational and/or elastic properties. By fusing two of more nanoparticles of the same kind (e.g., of the same chemical element, compound, or synthesized material) or different kinds (e.g., of different chemical elements, compounds, or synthesized materials), one can achieve another kind of behavior.

Every crystal lattice is trying to accommodate itself in its behavior to the surrounding physical environment during the hardening process. This involved all of the parameters related to conditions in the environment (e.g., pressure, temperature, gravity, outer magnetic field, etc.) that are relevant to determining the relaxation time.

Lattice resonant eigenfrequencies of particular sorts of nanoparticles have to be disrupted in order to get them permanently dynamically unstable (e.g., different frequencies may correspond to different desired dynamical effects), and to have a desired dynamical property inside of a system where the nanoparticles are applied.

As further described below, a particle programming array can be equipped with an ultrasonic sound generator that is applied to soft, newly-milled material to influence its crystal lattice (e.g., to alter the vibrational properties) as it hardens. By employing the ultrasonic sound generator, particles can be kept soft as long as possible through applied vibration on the walls and transport tunnels to ensure the particles are not attracted by a housing or a surface of a nanomill during transport after the process of colliding and before relaxing them after programming.

Additionally or alternatively, the particle programming array can be equipped with a magnetic pulse generator that can be applied to the soft, newly-milled material to influence its crystal lattice as it hardens. Applied ultrasound and magnetic field have greater or less effect to the desired transfer of energy and information to the nanoparticles by the programming system described herein. Note that the programming system deals with the physics of information rather than simply the energy aspect that is the subject of the classical approach to physics and nanotechnology.

Applied pulsing modulated magnetic fields have a purpose to support structuring of needed crystal lattice together with high-potential discharge with plasma generated during that process to add needed energy and information inside of electron spin structure. That spin structure can be allocated somewhere it is needed to give better adjustability. Said another way, that spin structure can provide a better way for tuning the particle inside of a programming device. It is a really difficult task to reprogram a material without adding extra energy into the structure to adjust at the electron level. Accordingly, the ultrasonic sound generator may have multiple purposes here: one for keeping the material vibrating at low-energy tension and keeping the material soft after colliding, and another one to keep material away from the surface where material is transported inside the programming device during the process.

Embodiments of the technology disclosed herein include methods to form nanoparticles. A mechanical milling process induced by aerodynamic, centrifugal, and centripetal principles can be further augmented by ultrasound, magnetic pulse, and high voltage impact. The mechanical milling process can be performed in an atmosphere and luminance controlled environment. Methods include forming and regimenting particle design and properties such as size, shape, repulsion, and hardness. High volumes of monolith nanoparticles and nanoparticle compositions can be yielded from macro or micro sourced minerals, metals, and/or organic matter. Some methods of forming nanoparticles include manufacturing nanoparticles on an industrial scale for a variety of applications.

Conventional methods to manufacture nanomaterial composites are time and energy intensive even for small volume output. Conventional methods can rely on complicated chemical procedures and processes and often require multi-step procedures that result in a wide distribution of particle sizes and a low reaction yield.

The technique disclosed herein provides a less energy intensive and high yield method for forming monolith and composite nanoparticles. The particles are generated through impact collision with the particles themselves resulting in a chaotic nanoparticle structure. Nanoparticles formed by the method described herein have a significantly larger active surface area than the surface area of conventionally formed nanoparticles.

The apparatus and method utilize low energy aerodynamics in addition to centrifugal and centripetal forces augmented by ultrasound waves to grind soft and hard material down to, e.g., a single digit nm size. The nanoparticle product can be specifically designed for a variety of applications and is scalable for mass production.

A device for producing nanoparticles is referred to as a "nanomill." A plurality of nanomills is referred to as a "nanomill farm." A nanomill farm includes nanomills operating in a parallel or serial progression to manufacture monolith and/or composite nanomaterial.

The nanomill apparatus and method is an improvement over conventional tribomechanical micronization and activation (TMA). TMA typically involves use of opposing rotors with multiple extruding pins that physically impact particles. Impacting particles with rotors results in unpredictable micro and macro particle sizes and wears down the rotors. In addition to physical wear and tear on rotors resulting from particle impacts, nanoparticle yield produced using TMA is contaminated with rotor residue. Impurities in nanoparticle yield can cause unpredictable and undesirable nanoparticle behavior.

In contrast, the disclosed technique does not rely on rotor impacts to produce nanoparticle. The disclosed nanomill includes aerodynamic vanes that direct nanoparticles to a collision region where nanoparticles collide with one another without impacting the aerodynamic vanes. By directing nanoparticles away from aerodynamic vanes, the aerodynamic vanes do not suffer from wear and tear from a constant bombardment of nanoparticle collisions. In addition, nanoparticle yield produced by the nanomill do not have a friction residue from collisions with aerodynamic vanes. The nanomill does not destroy or damage the structure and integrity of the material yield.

The TMA method produces micro to macro size granules, often yielding an unpredictable outcome when it comes to particle shape and size. In contrast, the nanomill uses micro or macro sized granules to produce designed conformities of predictable nanoparticle sizes and shapes. The nanomill can be configured to form a predictable nanoparticle yield, as well as physically structure and frequency adjust nanoparticles. The nanomill can manipulate nanoparticle structures and form synthetic composites of said particles.

FIGS. 1-22 show various components and configurations of a nanomill. The nanomill can be used for forming nanoparticles having a particular size, shape, and crystal lattice structure. The nanomill causes macro and/or micro sized granulated metals, minerals, and/or biomaterials to collide with one another.

The nanomill has two flowing streams of particles that rotate in air stream channels in opposite directions pushed outward by a centrifugal force of each channel, intercepting the opposite flow and thus crushing the materials in the process. The flow streams collide at a speed of 10,000 revolutions per minute (RPM) and can exceed 100,000 RPM depending on a radius of the channels. A nanomill can include, for example, seven or more air stream channels. Outward migration from one air stream channel to another air stream channel can result in collisions between particles traveling in approximately opposite directions.

Rather than including simple pins or blades like a TMA machine, the nanomill includes aerodynamic vanes that cause an aerodynamic effect. The aerodynamic effect reduces or eliminates friction residue and reduces maintenance. Materials are placed in a hopper and funneled into a duct into the nanomill core. The rotation of the rotors and the suction from the contours (wings) pull them into a centrifugal spin outward. The pull is amplified by the aerodynamic vacuum generated by the aerodynamic vanes. The pull of the opposing rotors smashes the materials against each other so they break into smaller particles. The pull pushes the materials out of the core in a smaller material size than when they entered the process—and this can be repeated until the selected nanometer size is achieved.

The nanomill process is an aerodynamic mechanical method where two opposing turbine wheels having a plurality of aerodynamic vanes generate a vacuum pull, pulling macro materials from two opposite directions and smashing them against each other. The pull accelerates towards the outer perimeter of the wheels and extrudes uniquely porous and cracked nanomaterials which are then automatically recycled through the nanomill again until the desired nanometer size is achieved.

The nanomill can process various materials down to a nanometer size. For example, the nanomill can process metals (e.g., tungsten), semiconductors (e.g., carbon, silicon, germanium, etc.), minerals (e.g., goethite), organic matter, or any combination thereof.

An internal portion of the nanomill can be sealable from the outside environment. A pressure, temperature, humidity, and gaseous composition of the internal portion of the nanomill can be adjusted. The nanomill can operate in a wide range of temperatures including, for example, below freezing for biological matter or elevated temperatures for metals (e.g., approximately 500° C. or higher). The nanomill can operate under various atmospheric pressures including in total vacuum and high pressure (e.g., 2 atmospheres, 3 atmosphere, or a higher pressure). The nanomill can include a particular atmospheric composition (e.g., nitrogen and/or argon), for example, to avoid oxidation. The nanomill can include controlled humidity environment (e.g., no humidity or low humidity), for example, to reduce reactions with or catalyzed by the presence of water (e.g., oxidation).

The nanoparticle output can be predetermined to any nm size almost down to atomic level. A commercial nanomill unit, or a farm of nanomill units can manufacture hundreds of tons of nanomaterials per day. The nanoparticle output can be substantially free of impurities due to the aerodynamic design and atmospheric control of the nanomill.

FIG. 1 shows a cross-sectional side view of a nanomill 100, according to an embodiment. The nanomill 100 includes a rotor 124a disposed opposite of a rotor 124b. Rotors 124a and 124b each include aerodynamic vanes (e.g., aerodynamic vanes 122a and 122b). Rotors 124a and 124b can rotate in opposite directions causing opposing aerodynamic vanes to rotate passed one another.

Material can be inserted into the nanomill 100. For example, material can be inserted into a material input hopper 101. The material input hopper 101 can be located near or at a center of the nanomill 100. The material input hopper can be within a proximity of a common axis of rotation of a first rotor and a second rotor. The first and second rotors can rotate in opposite directions. Rotation of opposing rotors of the nanomill 100 can cause granulated material (e.g., minerals, metals, and/or biological matter) to be broken down to nanometer sizes. For example, the nanomill 100 can break down particles to ranges of approximately 1 nm to approximately 500 nm, and ranges therebetween. Different materials can result in different size ranges. For example, biomaterials can result in sizes ranging from approximately 50 nm to approximately 200 nm.

The nanomill 100 can be placed inside a sealed atmosphere controlled chamber capable of producing extreme heat and cold, humidity, bar pressure, light or darkness—all of which can be adjusted to achieve the desired outcome for various materials. The milling, intermediate processing steps, and the packaging process can take place inside the atmosphere controlled chamber.

The milling process takes place in a core of the nanomill 100. The core is a region between rotors (e.g., rotor 124a and rotor 124b) where aerodynamic vanes (e.g., aerodynamic vanes 122a and 122b) can turn in opposite directions. The rotors can rotate at various speeds including, for example, speeds of up to 10,000 RPMs. The time frame for a single run of the nanomill 100 is determined by the material being milled at each time. Achieving nanometer sizes can involve a single run or more than one run through the nanomill.

Figure 4:
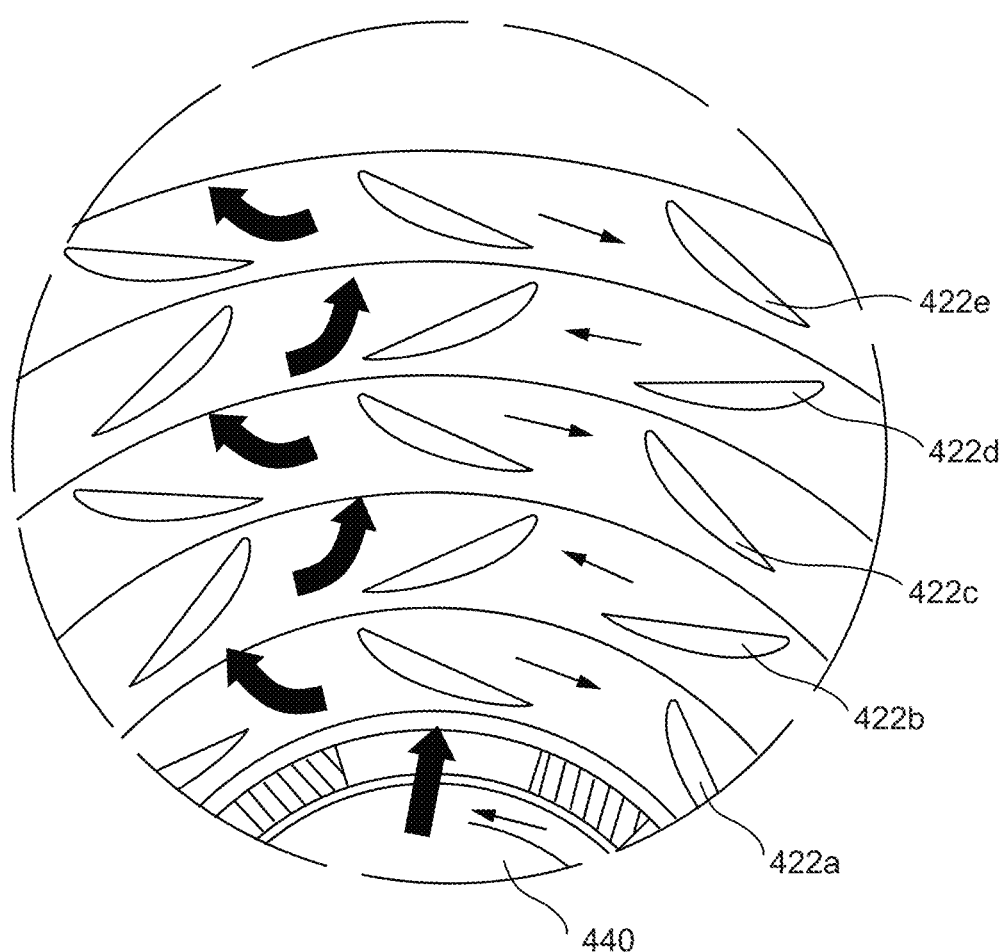
FIG. 4 shows a cross-sectional top view of a particle flow through a nanoparticle mill, according to an embodiment.

Aerodynamic vanes (e.g., aerodynamic vanes 122a and 122b) are held in place by a rotor (e.g., the rotor 124a or the rotor 124b). Alternating rows of aerodynamic vanes can be held in place by opposing rotors. For example, a first row, third row, and fifth row can be held in place by a first rotor (e.g., rotor 124a) and a second row and a fourth row can be held in place by a second rotor (e.g., rotor 124b). The first rotor and the second rotor can be on opposite sides. The first rotor and the second rotor can spin in opposite directions causing the first, third, and fifth rows to spin in an opposite direction as the second and fourth row. Rows having aerodynamic vanes in an opposing spin can cause an air current pattern in the nanomill 100, as shown in FIG. 4.

A single run through the nanomill 100 achieves a limited downgrading in size and shape but is increased with the number of rows inside the airflow chamber. Several runs can be done spontaneously by recycling the milled materials through an airflow duct. The milled materials can pass through a detector which determines the nanometer size of material passing by through the detector.

Once the desired size has been achieved the nanomaterial is funneled into a resonance frequency adjuster and a process which is determined by harmonics algorithms. The hardening time for each milled nanomaterial dictates the waiting time for when it is ready for the next stage. A second stage can be to synthesize the milled nanomaterial with other nanomaterials. This is a variant to the process where a separate nanomill 100 run of two or more materials can produce new nanomaterial designs.

In an embodiment, the synthesized materials are not milled again but glued or heated to achieve the synthesized format. Once the frequency of a nanomaterial run is established (or a synthesized run) the nanomaterials are placed in a second hopper. The nanoparticles are then processed. Processing can include, for example, preparing for analysis, sample gathering, and packing.

Packaged nanomaterials are conveyed to a neutralizing chamber where the packaged materials can be prepared for exposure to a non-controlled environment. Nanomaterials can be transported to either a warehouse or to a transport facility. Nanomaterials can be sealed in a protective environment throughout the processing steps to reduce a likelihood of human exposure.

Figure 2:
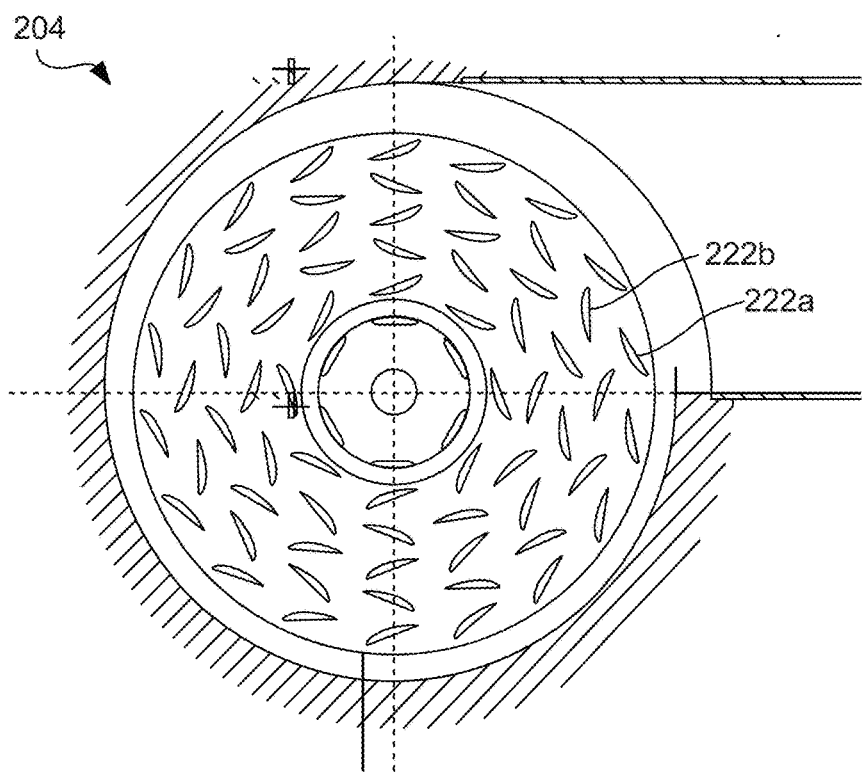
FIG. 2 shows a cross-sectional top view of a nanoparticle mill, according to an embodiment.
Figure 3:
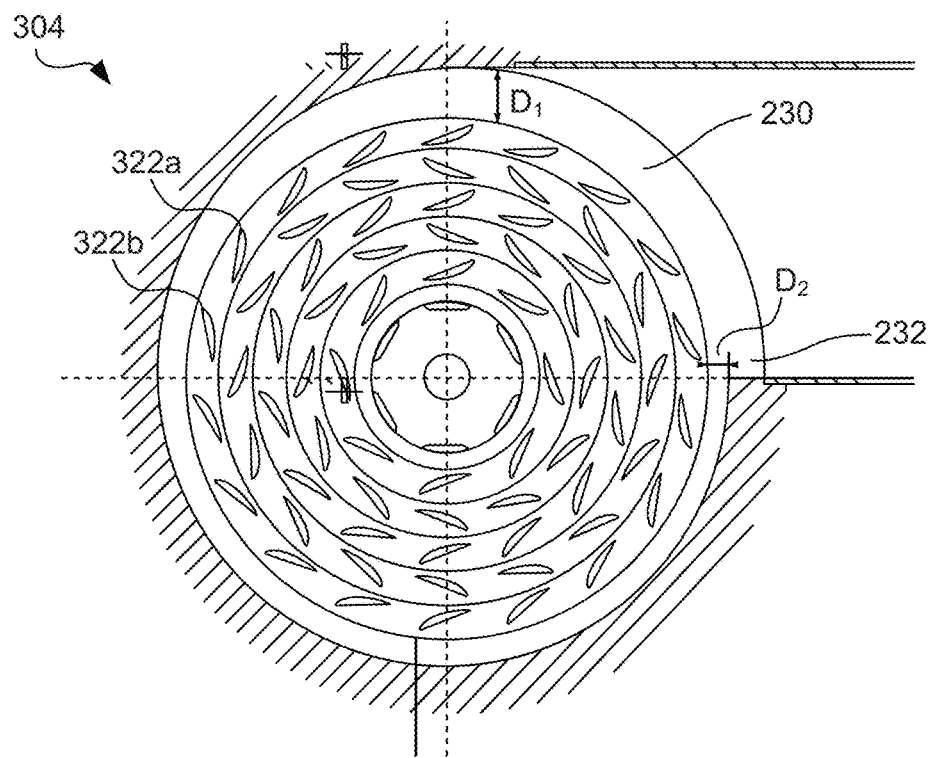
FIG. 3 shows a cross-sectional top view of a nanoparticle mill, according to an embodiment.

FIGS. 2 and 3 show a cross sectional top view of a nanomill core 204 and 304, respectively, according to an embodiment. Cross sections of aerodynamic vanes (e.g., aerodynamic vanes 122a and 122b) are shown distributed in circular rows around cores 204 and 304.

In FIG. 2, a cross-sectional top view of the nanomill core 204 is illustrated. The nanomill core 204 includes a plurality of circular rows of aerodynamic vanes. Aerodynamic vanes in each row are oriented in opposite directions as adjacent rows. For example, an outer row includes an aerodynamic vane 222a and an row adjacent to the outer row includes an aerodynamic vane 222b where the aerodynamic vane 222a and 222b are oriented in approximately opposite directions.

In FIG. 3, a cross-sectional top view of the nanomill core 304 is illustrated, according to an embodiment. Aerodynamic vanes (e.g., aerodynamic vane 322a and 322b) along a row in the nanomill can be separated by a distance and/or a degree apart. In an embodiment, distances between aerodynamic vanes can remain substantially constant among rows and degrees apart can increase from outer rows to inner rows. For example, blade casings can be 20 degrees apart in an first row (e.g., an outer row), 22.5 degrees in a second row, 25 degrees apart in a third row, 27.5 degrees apart in a fourth row, and 30 degrees in a fifth row (e.g., an inner row). In another embodiment, distances between aerodynamic vanes can change from one row to another and degrees apart can remain substantially constant. In another embodiment, distances between aerodynamic vanes can be less in outer rows than in inner rows and degrees apart among vanes in a row can increase from outer rows to inner rows. Smaller distances between aerodynamic vanes in outer rows can result in progressively smaller particle sizes as particles move from inner rows to outer rows, as discussed below with respect to FIG. 4.

Numbers of aerodynamic vanes in each row can vary among rows. In an embodiment, outer rows can include more vanes than inner rows. For example, 16 aerodynamic vanes can be included with a separation of 22.5 degrees in an outer row and 12 aerodynamic vanes can be included with a separation of 30 degrees in an inner row.

FIG. 4 shows a cross-sectional top view of a particle flow through a nanomill, according to an embodiment. The simplified diagram shows how motion of the aerodynamic vane can propel material from an inner portion of the nanomill to an outer portion of the nanomill. The simplified diagram also shows alternating directions of aerodynamic vanes from one row to the next. The alternating directions can assist in breaking down particles to the nano scale.

Granules can be placed in a hopper and collected into a central region of the nanomill core. Material can enter the center region of the nanomill core and be propelled outward. Arrows show a path of material flow from an inner portion of the nanomill core to an outer portion of the nanomill core. Material can, for example, begin in a central region 440, travel passed an inner row including aerodynamic vane 422a, one or more middle rows (e.g., a row including aerodynamic vane 422b, a row including aerodynamic vane 422c, and a row including aerodynamic vane 422d), and an outer row including aerodynamic vane 422d.

An aerodynamic force generated by a motion of the aerodynamic vanes can propel material from the inner portion of the nanomill to the out portion of the nanomill. A vacuum region can be created adjacent to an inner side of an aerodynamic vane (e.g., a side of the aerodynamic vane oriented toward the central region) and a high pressure region can be created adjacent to an outer side of the aerodynamic vane (e.g., a side of the aerodynamic vane oriented away from the central region). The vacuum region pulls material toward the aerodynamic vanes in an outward direction and the high pressure region pushes material away from aerodynamic vanes in an outward direction. Thus, the vacuum region and high pressure region result in complementary aerodynamic forces that both pull material outward and push material outward.

An impact region exists between aerodynamic vanes. For example, an impact region exists between aerodynamic vanes of adjacent rows (e.g., aerodynamic vanes 422d and 422e) as the aerodynamic vanes pass by one another. Currents created by the motion of aerodynamic vanes direct particles to the impact region where the particles collide. Particle size is reduced by causing particle collisions in impact regions among the plurality of rows. Particle flow toward the impact region is discussed below, with reference to FIG. 5.

A spacing between aerodynamic vanes can decrease from an inner row to an outer row. Particle sizes can be initially reduced by an inner collision and further reduced by subsequent outer collisions. Decreased spacing between aerodynamic vanes in outer rows can result in progressively smaller particle sizes as particles travel from an inner portion of a nanomill to an outer portion of the nanomill.

Figure 5:
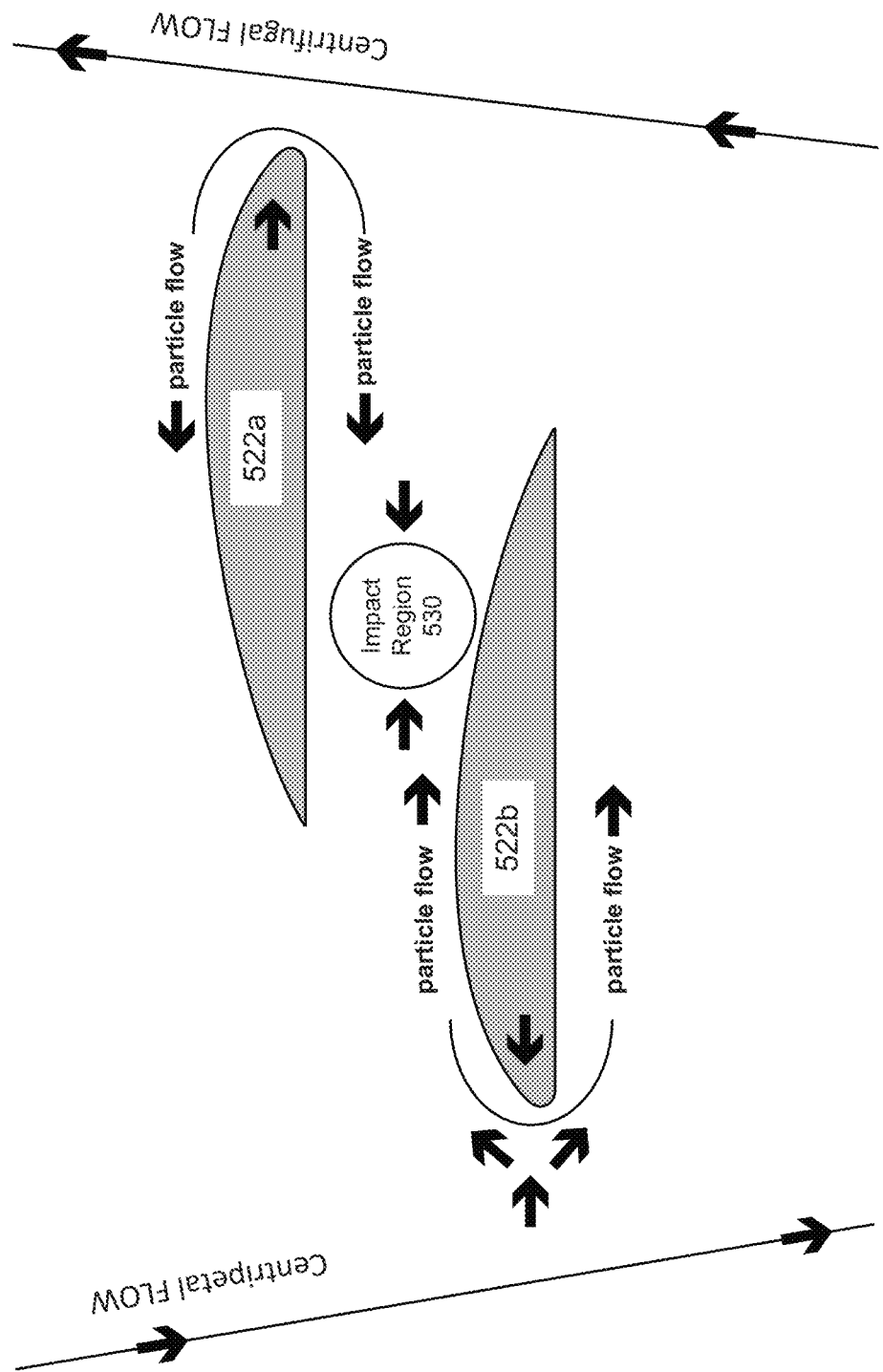
FIG. 5 shows a cross-sectional view of particle flow around aerodynamic vanes during nanoparticle mill rotation, according to an embodiment.

FIG. 5 shows a cross-sectional view of particle flow around aerodynamic vanes during nanomill rotation, according to an embodiment. A cross-section of the aerodynamic vanes can have an airfoil-shape. The airfoil-shape can be symmetric or cambered. An airfoil-shaped body moved through a fluid produces an aerodynamic force. The aerodynamic force and can be resolved into two components from a vacuum region (resulting in a particle pulling force) and a high pressure region (resulting in a particle pushing force). A turning of air in the vicinity of the airfoil creates curved streamlines, resulting in lower pressure on one side and higher pressure on the other. This pressure difference is accompanied by a velocity difference, via Bernoulli's principle, so the resulting flowfield about the airfoil has a higher average velocity on the outer surface than on the inner surface. The particle pulling force can be related directly to the average outer/inner velocity difference without computing the pressure by using the concept of circulation and the Kutta-Joukowski theorem. The aerodynamic forces exerted on a particle cause the particle to move from a central region of the nanomill core to an outer region of the nanomill core.

At the surface of the airfoil, the pressure exerts a force equal in magnitude and opposite in direction on the air. This pressure affects the air out to a distance of $\Delta y$, often many airfoil chord lengths from the surface. Newton's second law in differential form is $$dF_{airfoil} = \rho (ds/dt) \cdot (dv/ds) dA \, dr$$

where

ρ(s, r) is the air density in the volume dV=ds×dr×unit span.

ds/dt=v(s, r)=v(s, r) is the air speed, v(s, r) is the velocity of the surrounding fluid, dA is the differential surface area element, r is a distance normal to the surface at ds.

s is a distance along the surface.

A minus sign is included to calculate the force on the airfoil. By omitting the minus sign, the force the airfoil exerts on the surrounding fluid is calculated.

In FIG. 5, aerodynamic vane 522b is traveling to the left and aerodynamic vane 522a is traveling to the right. The behavior of the air in a boundary layer adjacent to aerodynamic vanes may be complex. A laminar flow can exist over the boundary layer of an aerodynamic vane resulting in a low pressure region on one side of the aerodynamic vane and a high pressure region on another side of the aerodynamic vane. For example, motion of aerodynamic vanes 522a and 522b can create a high pressure region below aerodynamic vanes 522a and 522b and a low pressure region above aerodynamic vanes 522a and 522b. The high pressure region below aerodynamic vane 522a and the low pressure region above aerodynamic vane 522b can operate in concert to draw particles into an impact region 530 between aerodynamic vanes 522a and 522b.

Figure 6A:
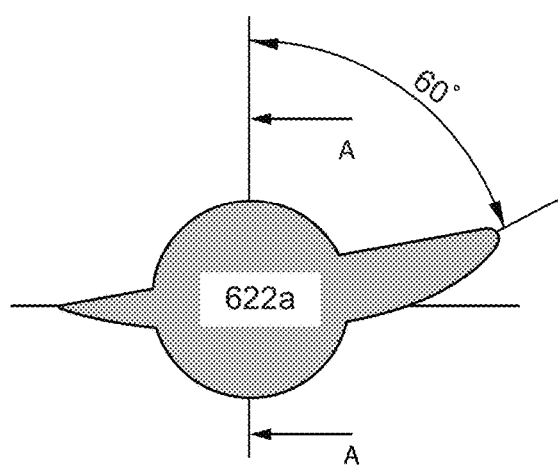
FIG. 6A shows a cross-sectional view of an aerodynamic vane positioned at a first tilt angle, according to an embodiment.
Figure 6B:
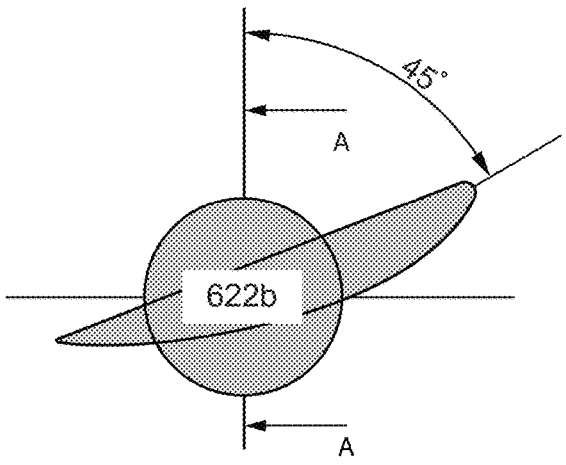
FIG. 6B shows a cross-sectional view of an aerodynamic vane positioned at a second tilt angle, according to an embodiment.

FIGS. 6A-6B show a cross-sectional view of aerodynamic vanes positioned at a first tilt angle and a second tilt angle, respectively, according to an embodiment. A tilt angle can be measured from a centerline along a length of an aerodynamic vane to a line perpendicular to a direction of motion (e.g., a line extending from a center of a nanomill core to an outer wall of the nanomill core) or to a line associated with the direction of motion (e.g., a tangent of any concentric circle corresponding to a row among a plurality of rows in a nanomill core). In FIG. 6A, aerodynamic vane 622a has a tilt angle of 60 degrees as measured from the centerline to the perpendicular line or 30 degrees as measured from the centerline to the direction of motion. In FIG. 6B, aerodynamic vane 622b has a tilt angle of 45 degrees as measured from the centerline to the perpendicular line an 45 degrees as measured from the centerline to the direction of motion.

A tilt angle of an aerodynamic vane can be fixed or adjustable. A tilt angle can be adjustable by, for example, disposing the aerodynamic vane on a mechanical bearing. The mechanical bearing can enable the tilt angle to vary along a range of tilt angles. For example, the mechanical bearing can enable one or more aerodynamic vanes to be rotated along tilt angles ranging from approximately 30 degrees to approximately 150 degrees (and ranges therebetween) measured from measured from the centerline to the perpendicular line (i.e. 60 degrees to −60 degrees measured from the centerline to the direction of motion). Ranges therebetween measured from the centerline to the perpendicular line can include, for example, approximately 30 degrees to approximately 90 degrees, approximately 45 degrees to approximately 90 degrees, approximately 45 degrees to approximately 60 degrees, approximately 45 degrees to approximately 100 degrees, etc.

The tilt angle can be adjusted while the aerodynamic vane is in motion or while the aerodynamic vane is stationary. For example, a processor can control an actuator (e.g., including a piezoelectric bimorph and/or shape-memory alloy) configured to adjust the mechanical bearing to cause a tilt angle of the aerodynamic vane to change. The tilt angle can be changed based on, for example, a frequency of rotation of the aerodynamic vane (e.g., a revolution per minute), a speed of the aerodynamic vane, an acceleration of the aerodynamic vane, a row of the aerodynamic vane, a size of the aerodynamic vane, a shape of the aerodynamic vane (e.g., symmetric or cambered), a material type intended for milling, insertion of a quantity of material into a nanomill core, a size of a nanomill core, a number of rows of aerodynamic vanes in a nanomill core, or any combination thereof. For example, a steeper tilt angle (e.g., approximately 45 degrees) can be used at slow speeds and a more moderate tilt angle (e.g., approximately 60 degrees) can be used at higher speeds.

Figure 7A:
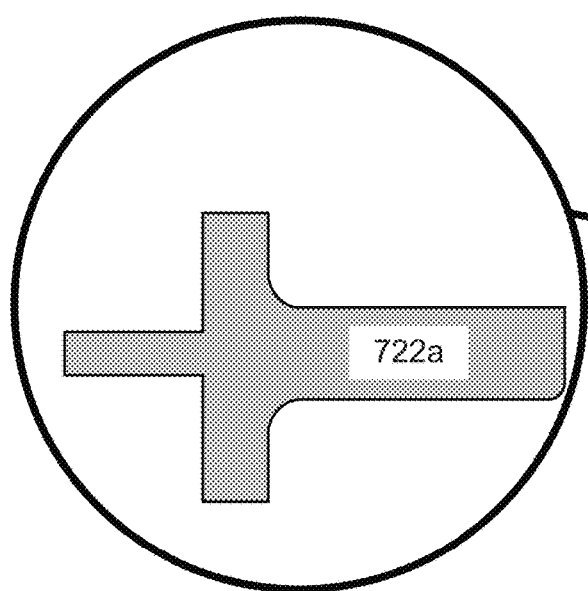
FIG. 7A shows a cross-sectional side view of a tiltable or fixed aerodynamic vane, according to an embodiment.
Figure 7B:
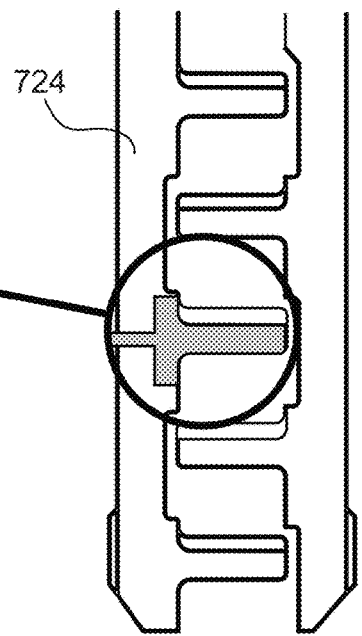
FIG. 7B shows a cross-sectional side view of a nanoparticle mill having a tiltable or fixed aerodynamic vane adjacent to other aerodynamic vanes, according to an embodiment.

FIGS. 7A and 7B show a cross-sectional side view of a tiltable or fixed aerodynamic vane, according to an embodiment. The aerodynamic vane shown in FIG. 7A can be inserted into a rotor as shown in FIG. 7B. The rotor 724 can include one or more aerodynamic vanes. For example, the rotor 424 can include a first inner row and one or more additional rows where each row can include one or more aerodynamic vanes. Each row can be a circle extending around the rotor 424.

In an embodiment, the rotor is configured to receive a plurality of aerodynamic vanes in a plurality of circular rows. For example, the rotor 724 can include a fastener element configured to receive an aerodynamic vane and secure the aerodynamic vane into place. Any or all of the aerodynamic vanes can be secured by fastener elements. For example, fastener elements can be disposed along a plurality of rows to receive the plurality of aerodynamic vanes in the plurality of rows. Fastener elements can be attached to rotation mechanism (e.g., a hinge or swivel joint). The rotation mechanism can be used to adjust a tilt angle of an aerodynamic vane. An actuator (e.g., including a shape-memory alloy) can cause the rotation mechanism to rotate around a fixed axis to adjust the tilt angle of the aerodynamic vane.

A first rotor is positioned adjacent to a second rotor. The second rotor can include rows of aerodynamic vanes that fit between rows of aerodynamic vanes of the first rotor. The first rotor and the second rotor can be caused to rotate in different directions. Rotation of the rotors with the aerodynamic vanes can cause particles to travel from an inner region to an outer region on the nanomill core.

FIG. 8 shows a cross-sectional top view of aerodynamic vanes in a plurality of rows, according to an embodiment. A tilt angle can vary from one row to the next. For example, a tilt angle of an aerodynamic vane in a first row can be steeper or flatter than a tilt angle of another aerodynamic vane in another row (e.g., an adjacent row). Tilt angles of aerodynamic vanes in inner rows can be steeper than tilt angles of aerodynamic vanes in outer rows.

FIG. 9 shows a cross-sectional top view of aerodynamic vanes in a plurality of rows, according to an embodiment. The tilt angle of the aerodynamic vanes can be approximately 90 degrees as measured from a centerline of the aerodynamic vane to a line perpendicular to a direction of motion.

Figure 10:
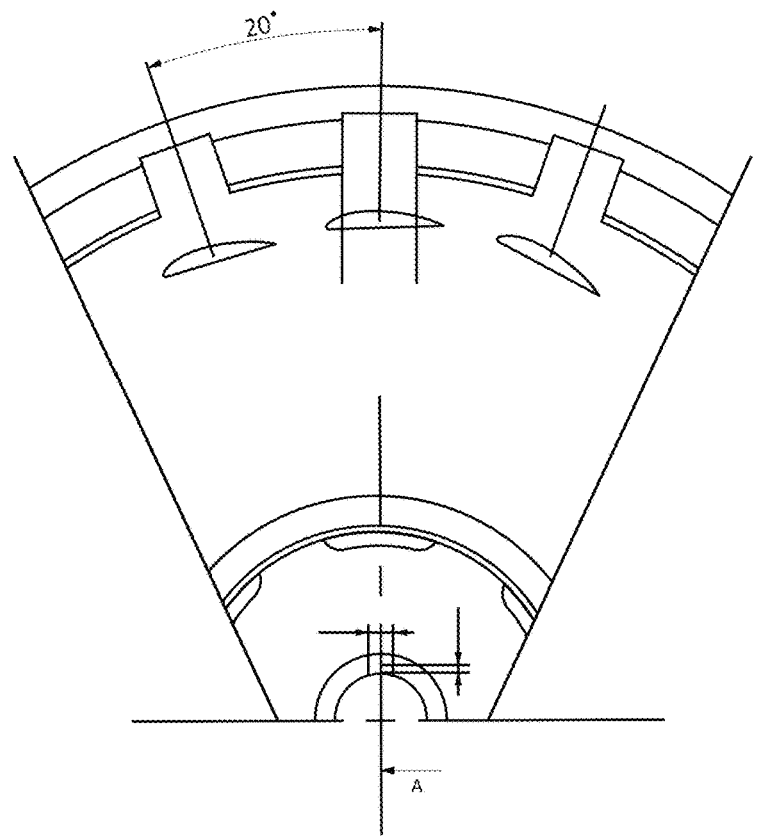
FIG. 10 shows a cross-sectional top view of aerodynamic vane positioning, according to an embodiment.
Figure 11:
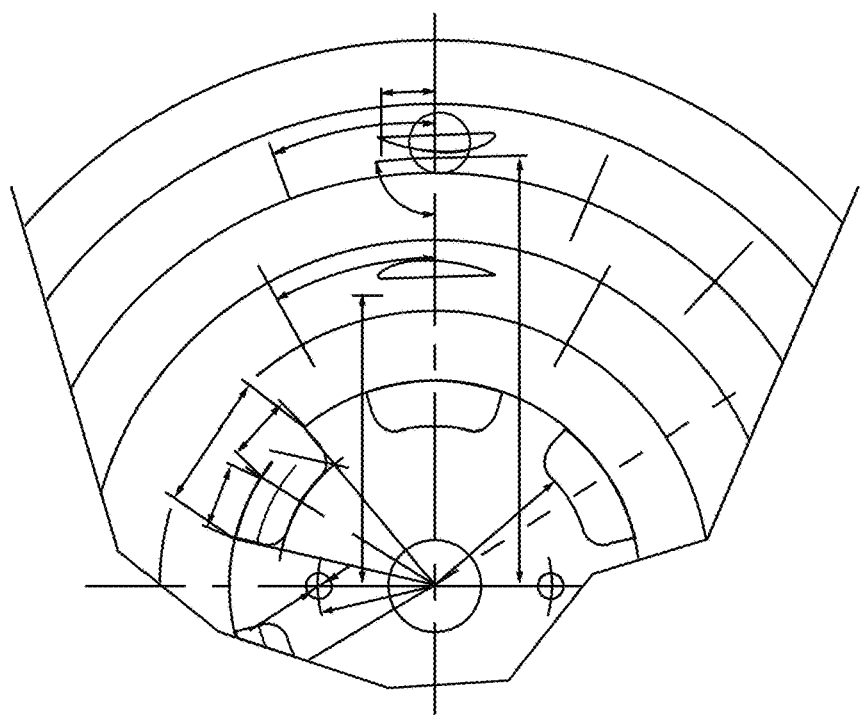
FIG. 11 shows a cross-sectional top view of aerodynamic vane positioning, according to an embodiment.
Figure 12:
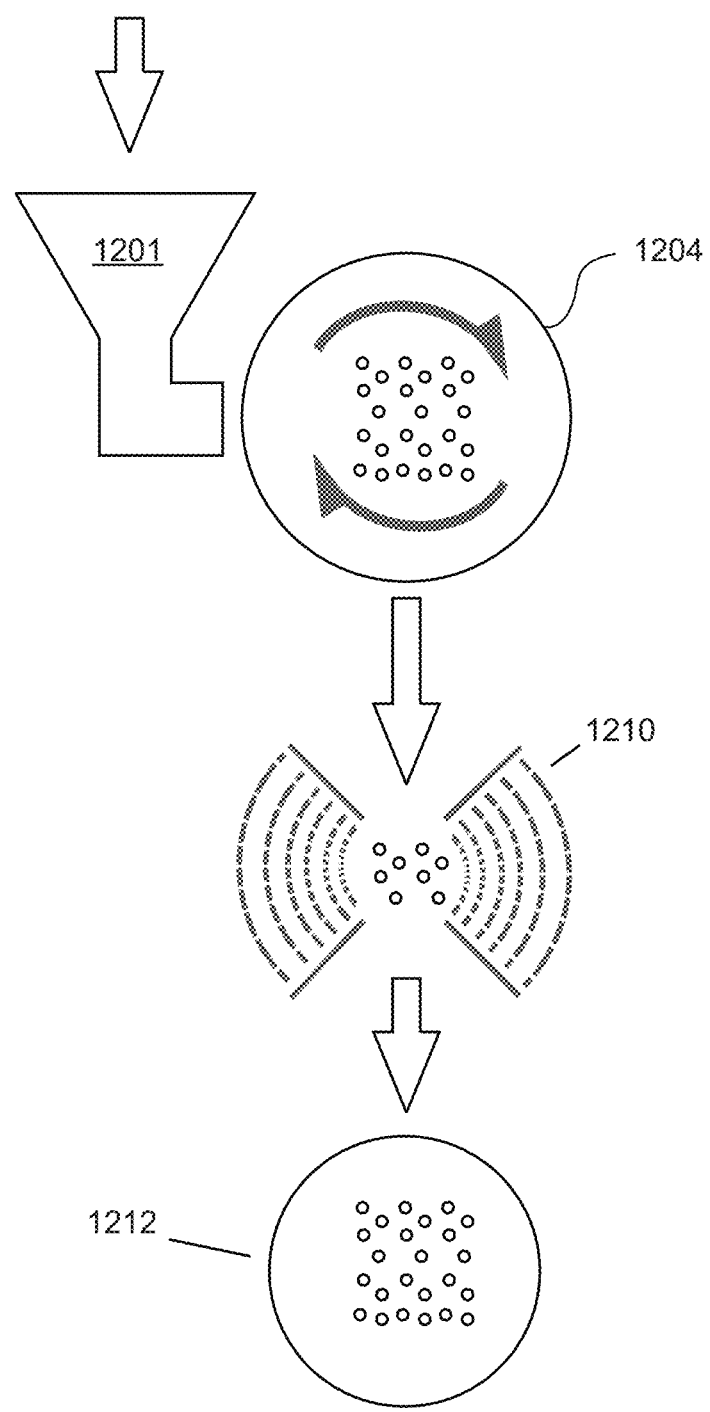
FIG. 12 shows a diagrammatic representation of a primary product line, according to an embodiment.

FIGS. 10 and 11 show a cross-sectional top view of aerodynamic vane positioning, according to an embodiment. Aerodynamic vanes along a row in the nanomill can be separated by a distance and/or a degree apart. In an embodiment, distances between aerodynamic vanes can remain substantially constant among rows and degrees apart can increase from outer rows to inner rows. For example, blade casings can be 20 degrees apart in an first row (e.g., an outer row), 22.5 degrees apart in a second row, 25 degrees apart in a third row, 27.5 degrees apart in a fourth row, and 30 degrees in a fifth row (e.g., an inner row). In another embodiment, distances between aerodynamic vanes can change from one row to another and degrees apart can remain substantially constant. In another embodiment, distances between aerodynamic vanes can be less in outer rows than in inner rows and degrees apart among vanes in a row can increase from outer rows to inner rows. Smaller distances between aerodynamic vanes in outer rows can result in progressively smaller particle sizes as particles move from inner rows to outer rows FIG. 12 shows a diagrammatic representation of a primary product line, according to an embodiment. Material (e.g., particle input) can enter material input hopper 1201. Material input hopper 1201 can direct material into a center region of a nanomill core 1204. Aerodynamic vanes attached to opposing rotors can create an aerodynamic force directing material from the center region of the nanomill core 1204 to an outer region of the nanomill core 1204. As material travels from the center region to the outer region, material collisions can occur in impact regions between aerodynamic vanes.

The outer region of the nanomill core 1204 includes an outer channel (e.g., outer channel 230). The outer channel directs material toward an exit duct. Material exiting the nanomill core through the exit duct can be redirected into the center region of the nanomill for further processing or directed into a particle programming array 1210.

The particle programming array 1210 can be managed by a particle programming control unit. The particle programming control unit can activate one or more particle programming devices. The particle programming array 1210 can include a plurality of particle programming devices including, for example, an ultrasound generator, a magnetic field generator, and a high voltage frequency generator. The particle programming array 1210 can be electrically connected to a high voltage frequency generator external to the particle programming array 1210. The particle programming devices are discussed further below with respect to FIG. 21.

Programmed particles can exit the particle programming array 1210 and enter a particle solidifying chamber 1210. Particles can remain in the particle solidifying chamber for at least a threshold time period. The threshold time period can vary based on one or more particle attributes including, for example, a particle size, composition, temperature, mass, or any combination thereof.

Figure 13:
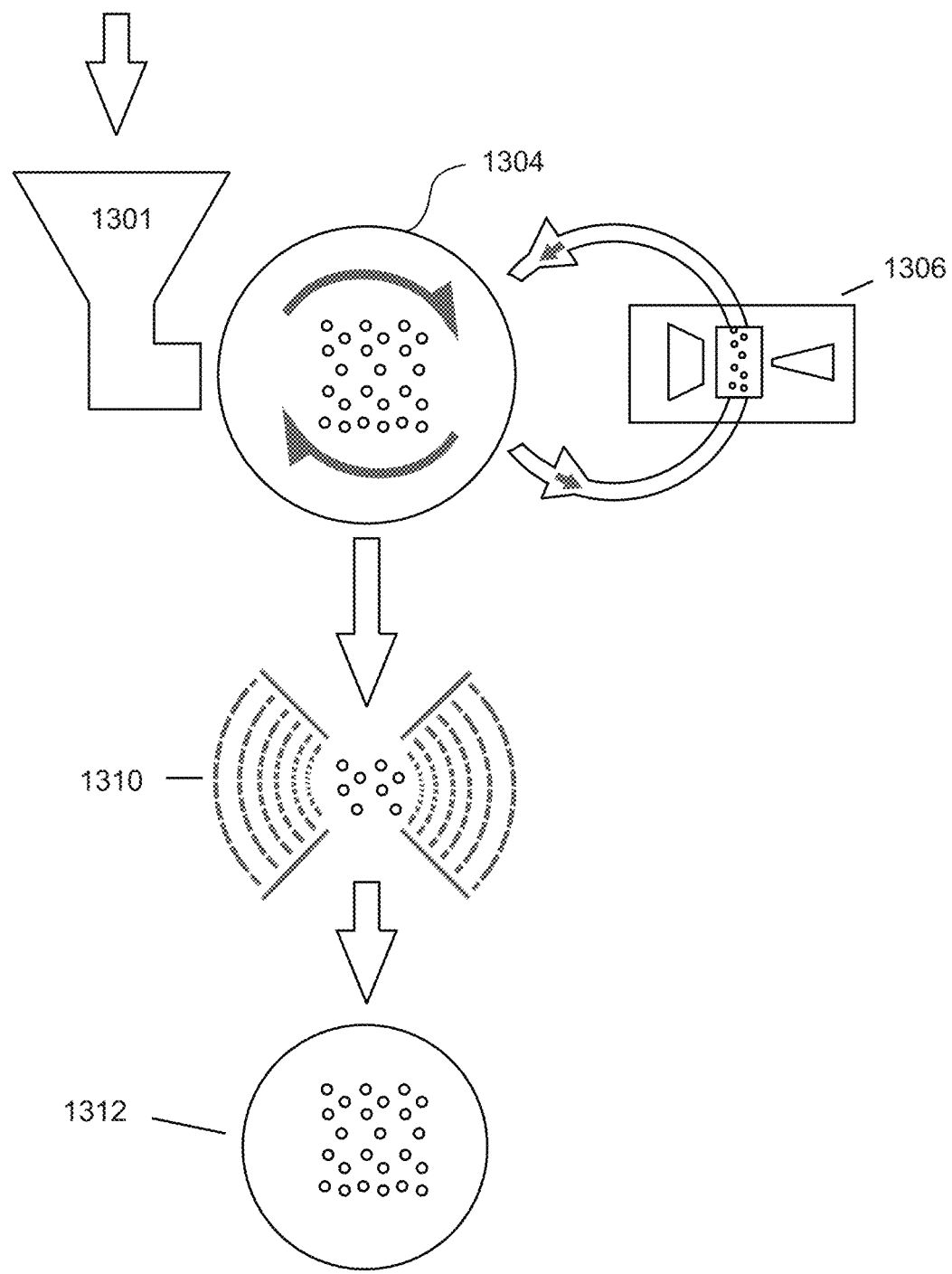
FIG. 13 shows a diagrammatic representation of a primary product line and a nanoparticle sampling line, according to an embodiment.

FIG. 13 shows a diagrammatic representation of a primary product line and a nanoparticle sampling line, according to an embodiment. The primary product line can include a material input hopper 1301, nanomill core 1304, particle sampling system 1306, particle programming array 1310, and a particle solidifying chamber 1312. The particle programming array 1310 can include and/or be electrically connected to a high voltage frequency generator. The particle sampling system 1306 can include a particle separator and an optical sensor array. An example of the particle sampling system 1306 is discussed below with reference to FIG. 17.

Figure 14:
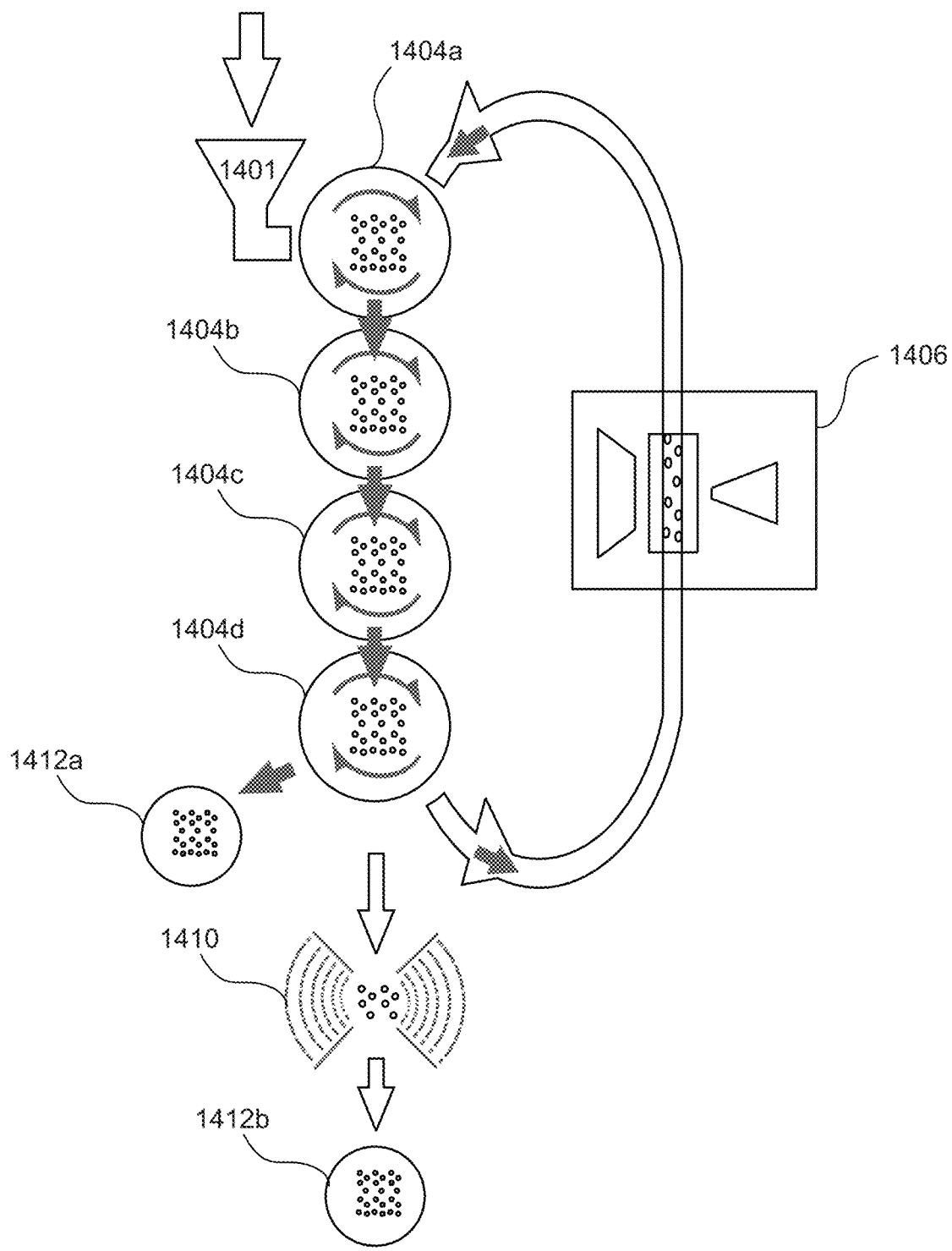
FIG. 14 shows a diagrammatic representation of nanoparticle mills configured to operate in series, according to an embodiment.

FIG. 14 shows a diagrammatic representation of nanomill units configured to operate in series, according to an embodiment. Material can enter the nanomill through a material input hopper 1401. Material can then go through one or more nanomill cores. The nanomill can include nanomill cores 1404a, 1404b, 1404c, and 1404d. A recycle element can recycle material through a particle sampling system 1406. An example of the particle sampling system 1406 is discussed below with reference to FIG. 17. Recycle material can reenter the nanomill cores 1404a, 1404b, 1404c, and 1404d. Particles exiting the series of nanomill cores (e.g., nanomill cores 1404a, 1404b, 1404c, and 1404d) can enter either of the particle solidifying chamber 1412a or particle programming array 1410. Particles directly entering the particle solidifying chamber 1412a are not programmed. Particle passing through the particle programming array 1410 can be programmed according one or more programming devices in the particle programming array 1410. Particles entering particle solidifying chamber 1412b can be programmed by the particle programming array 1410. Particles in either of the particle solidifying chamber 1412a and/or 1412b can solidify over a time period.

Figure 15:
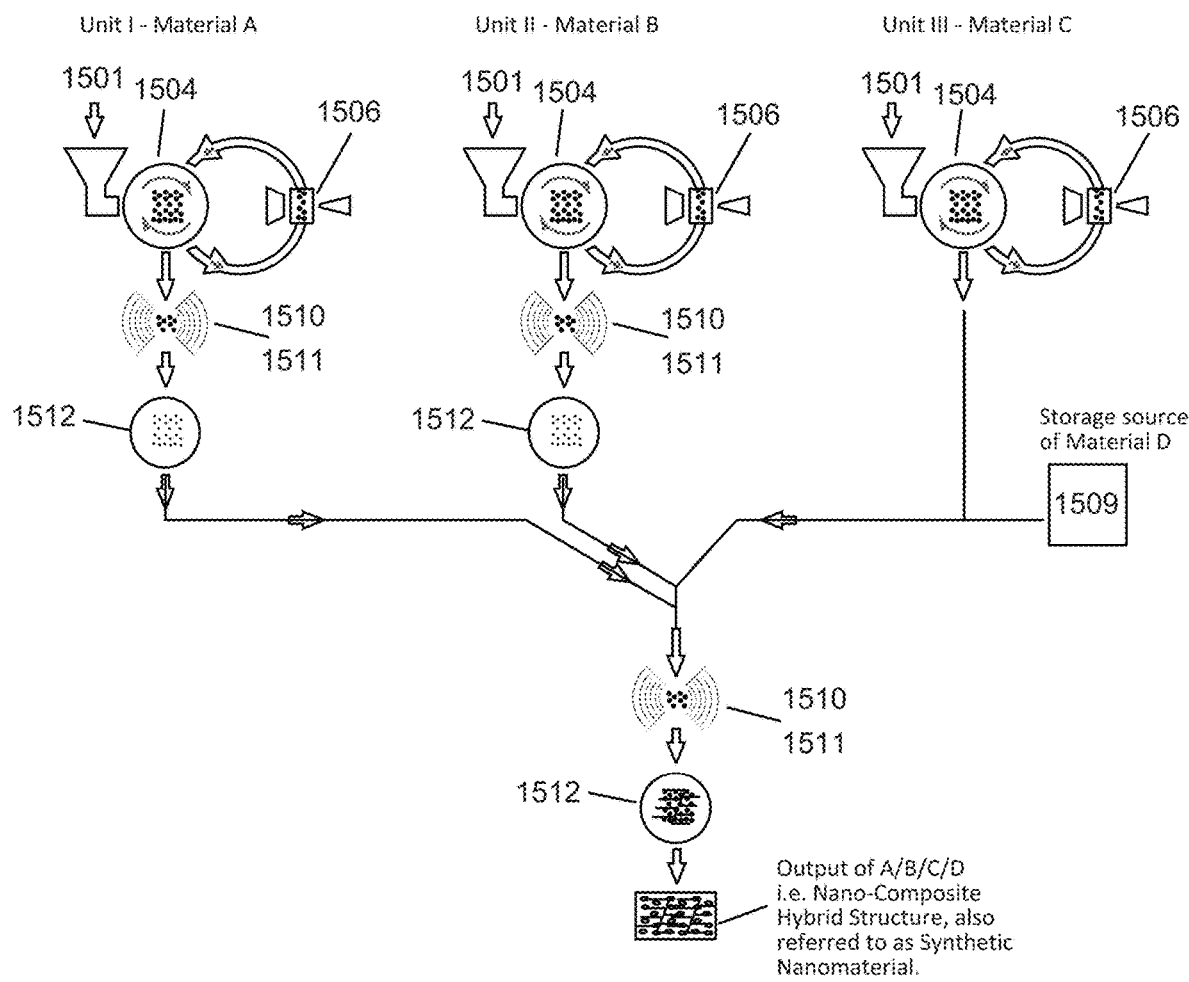
FIG. 15 shows a diagrammatic representation of nanoparticle mills configured to operate in parallel, according to an embodiment.

FIG. 15 shows a diagrammatic representation of nanomill units configured to operate in parallel, according to an embodiment. Two or more nanomill units can be configured to operate in parallel. For example, three nanomill units can be configured to operate in parallel with converging process lines following one or more processes (e.g., after particle programming of output from one or more nanomill units).

A first nanomill unit includes material input hopper 1501a, nanomill core 1504a, particle sampling system 1506a, particle programming array 1510a, and a particle solidifying chamber 1512a. Output from the nanomill core 1504a can be programmed by the particle programming array 1510a. Programmed output can solidifying in solidifying chamber 1512a. Solid programmed particles can leave the solidifying chamber 1512a and be merged with a product line of one or more other nanomill units.

A second nanomill unit includes material input hopper 1501b, nanomill core 1504b, particle sampling system 1506b, particle programming array 1510b, and a particle solidifying chamber 1512b. Output from the nanomill core 1504b can be programmed by the particle programming array 1510b. Programmed output can solidifying in solidifying chamber 1512b. Solid programmed particles can leave the solidifying chamber 1512b and be merged with a product line of one or more other nanomill units.

A third nanomill unit includes material input hopper 1501c, nanomill core 1504c, and particle sampling system 1506c. The third unit can lack a particle programming array and a particle solidifying chamber. Accordingly, a crystal lattice structure of output from the third nanomill may not be changed by a particle programming array. Output from the third nanomill can be merged with programmed and/or unprogrammed particles from one or more other nanomill units.

Outputs from one or more nanomill units can be merged. The merged output can be conveyed to a particle programming array 1510d to form particles having a composite hybrid structure. Particles having a composite hybrid structure can be referred to as synthetic particles or as having a synthetic composition. Particles programmed by particle programming array 1510d can be conveyed to solidifying chamber 1512d.

Figure 16:
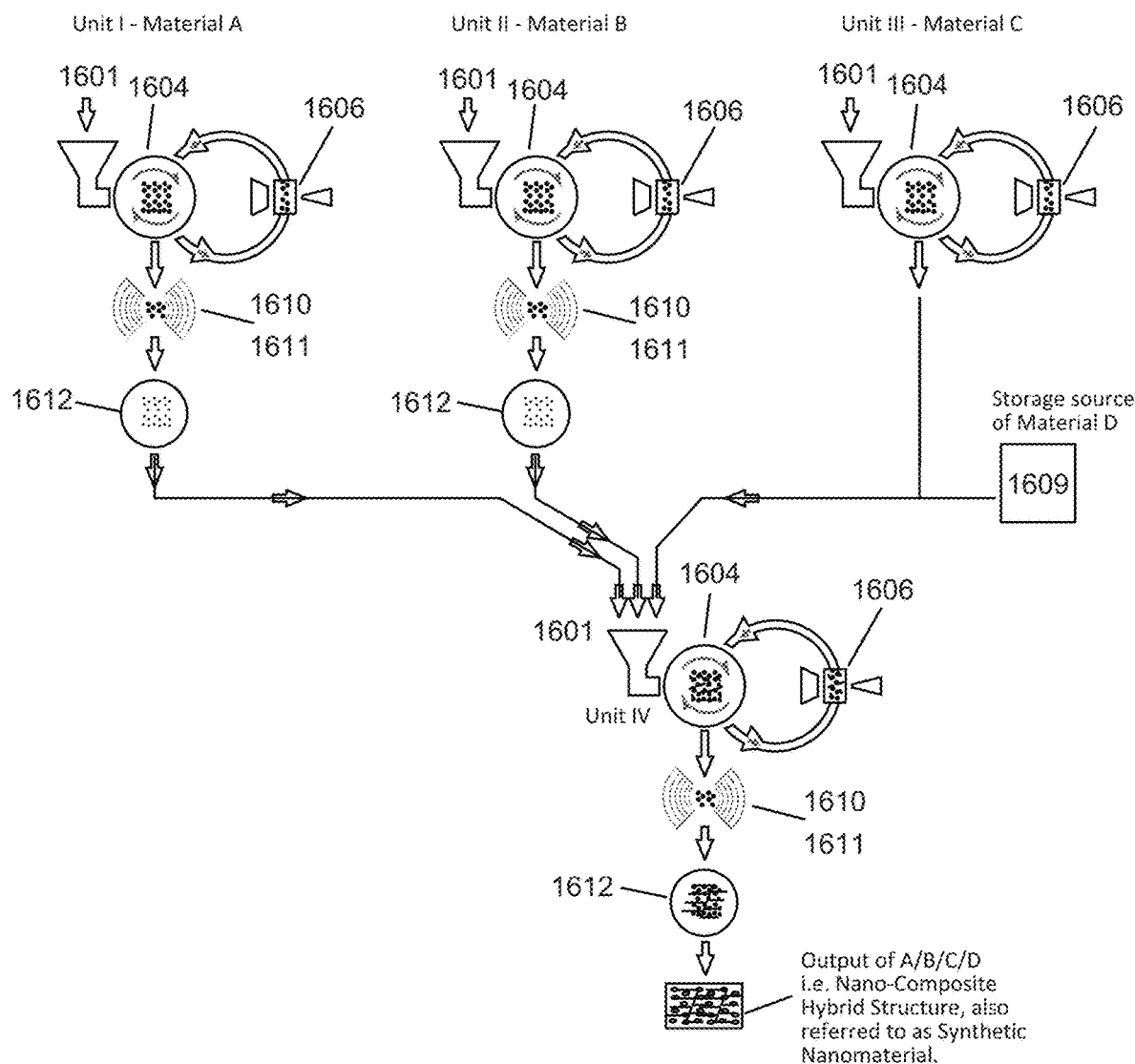
FIG. 16 shows a diagrammatic representation of nanoparticle mills configured to operate in series and parallel, according to an embodiment.

FIG. 16 shows a diagrammatic representation of nanomills configured to operate in series and parallel, according to an embodiment. Two or more nanomill units can be configured to operate both in series and in parallel. For example, three nanomill units can be configured to operate in parallel with converging process lines following one or more processes (e.g., after particle programming of output from one or more nanomill units) followed by one or more additional nanomill units.

A first nanomill unit includes material input hopper 1601a, nanomill core 1604a, particle sampling system 1606a, particle programming array 1610a, and a particle solidifying chamber 1612a. Output from the nanomill core 1604a can be programmed by the particle programming array 1610*a*. Programmed output can solidifying in solidifying chamber 1612*a*. Solid programmed particles can leave the solidifying chamber 1612*a* and be merged with a product line of one or more other nanomill units.

A second nanomill unit includes material input hopper 1601*b*, nanomill core 1604*b*, particle sampling system 1606*b*, particle programming array 1610*b*, and a particle solidifying chamber 1612*b*. Output from the nanomill core 1604*b* can be programmed by the particle programming array 1610*b*. Programmed output can solidifying in solidifying chamber 1612*b*. Solid programmed particles can leave the solidifying chamber 1612*b* and be merged with a product line of one or more other nanomill units.

A third nanomill unit includes material input hopper 1601*c*, nanomill core 1604*c*, and particle sampling system 1606*c*. The third unit can lack a particle programming array and a particle solidifying chamber. Accordingly, a crystal lattice structure of output from the third nanomill may not be changed by a particle programming array. Output from the third nanomill can be merged with programmed and/or unprogrammed particles from one or more other nanomill units.

Outputs from one or more nanomill units can be merged. The merged particle output can be conveyed through one or more additional nanomill units in series. For example, the merged particle output from the first, second, and third nanomill units can be conveyed to a fourth nanomill unit. The fourth nanomill unit can include material input hopper 1601*d*, nanomill core 1604*d*, particle sampling system 1606*d*, particle programming array 1610*d*, and a particle solidifying chamber 1612*d*. Output from the nanomill core 1604*d* can be programmed by the particle programming array 1610*d*. Programmed output can solidifying in solidifying chamber 1612*b*. Solid programmed particles can leave the solidifying chamber 1612*b* and be merged with a product line of one or more other nanomill units. Conveying merged particles through the fourth nanomill unit can result in nanoparticles having a composite hybrid structure. Particles having a composite hybrid structure can be referred to as synthetic particles or as having a synthetic composition.

Figure 17:
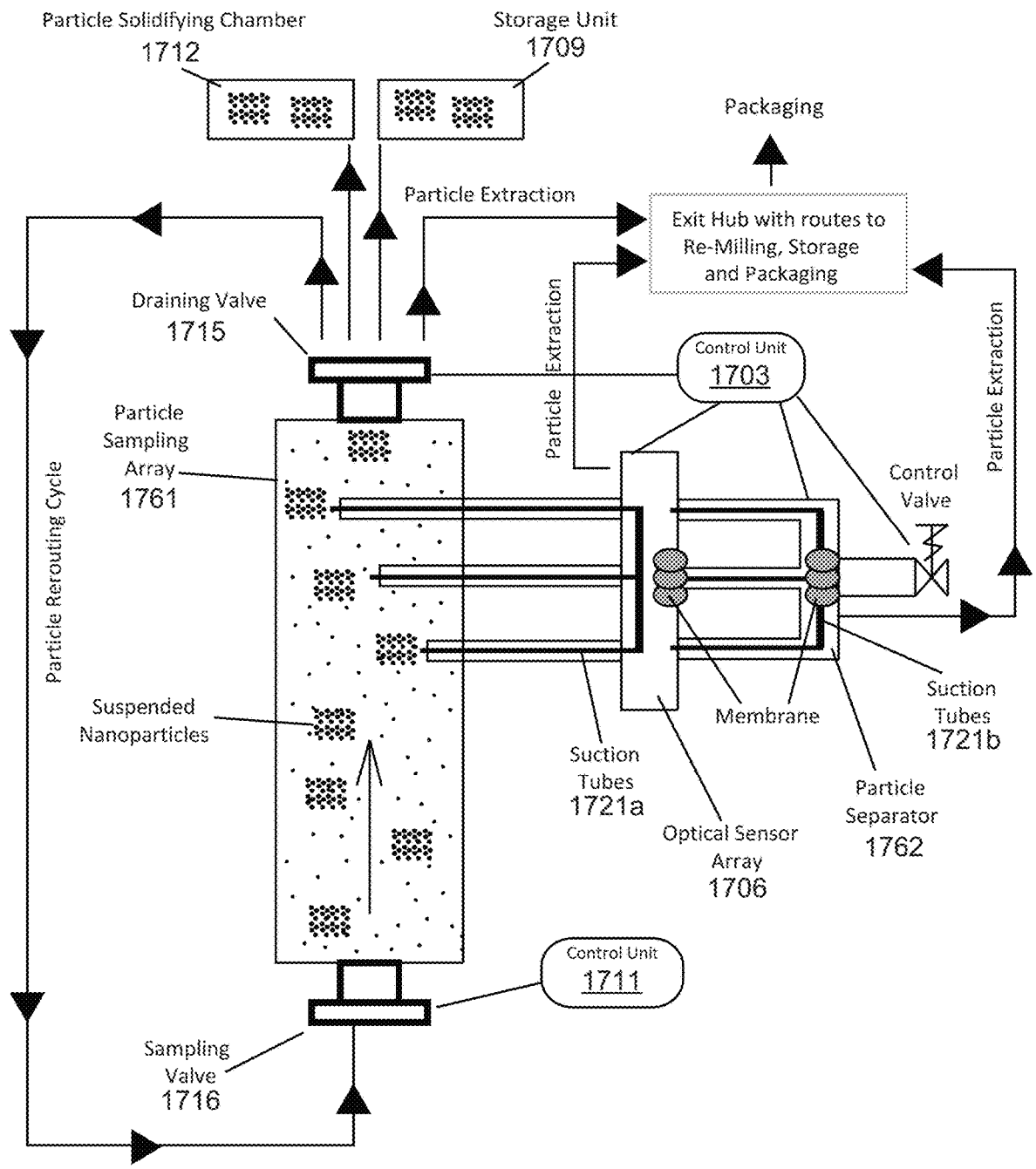
FIG. 17 shows a diagrammatic representation of a particle sampling array, an optical sensor array, a particle separator array, and a particle solidifying chamber, according to an embodiment.

FIG. 17 shows a diagrammatic representation of an particle sampling system, according to an embodiment. The particle sampling system can include a particle sampling array 1761, an optical sensor array 1706, a particle separating array 1762, a particle solidifying chamber 1712, a storage unit 1709, or any combination thereof.

A portion of particles in a nanomill core (e.g., nanomill core 104 of FIG. 1) can be routed into the particle sampling array 1761. Particle flow into the particle sampling array 1761 can be regulated by sampling valve 1716. Control unit 1711 can manage sampling valve 1716. For example, control unit 1711 can cause sampling valve 1716 to adjustably restrict flow into the particle sampling array 1761. Sampling valve 1716 can include a disc that can move linearly inside a valve, rotate on the stem, rotate on a hinge or trunnion, or any combination thereof. A drainage valve 1715 can manage a flow out of the particle sampling array 1761. Drainage valve 1715 can be managed by a control unit (e.g., control unit 1711 or 1703).

One or more suction tubes 1721*a* can direct particles from the particle sampling array 1761 to the optical sensor array 1706. The optical sensor array includes a group of sensors (e.g., deployed in a certain geometry pattern) that collect light from an group of opposing light sources. The sensors (e.g., electro-optical sensors) can convert light into an electronic signal. Electrical signals from the sensors of the optical sensor array can be transmitted to a computing device (e.g., control unit 1703). An absence of light detected by a sensor among the group of sensors can be determined to be obstructed by a particle. Adjacent sensors having a lack of light can be used to determine a size of a particle and/or a shape of a particle. For example, data indicative of a distance between adjacent sensors (e.g., a distance of 5 nm) can be stored in a database accessible to control unit 1703. Based on the data indicative of the distance between adjacent sensors and the identified sensors having an absence of light at a moment in time, the control unit 1703 can determine a size of a particle.

One or more suction tubes 1721*b* can direct particles from the optical sensor array 1706 to the particle separator 1762. The particle separator 1762 can extract particles from the passing flow.

The material exit hub distributes the material from the particle separator 1762 according to program specifications, i.e. either back to the nanomill for yet another run, or to storage unit 1709, particle programming, the particle solidifying chamber 1712, or particle packaging.

The remainder of the particle flow passing through the particle separator 1762 is either funneled back to the mill core, or directly to the particle programming array and possibly the particle solidifying chamber 1712. An additional option is to funnel particles directly to storage unit 1709 or packaging. An optional extraction route from the particle programming array is directly to storage unit 1709 or packaging.

Figure 18:
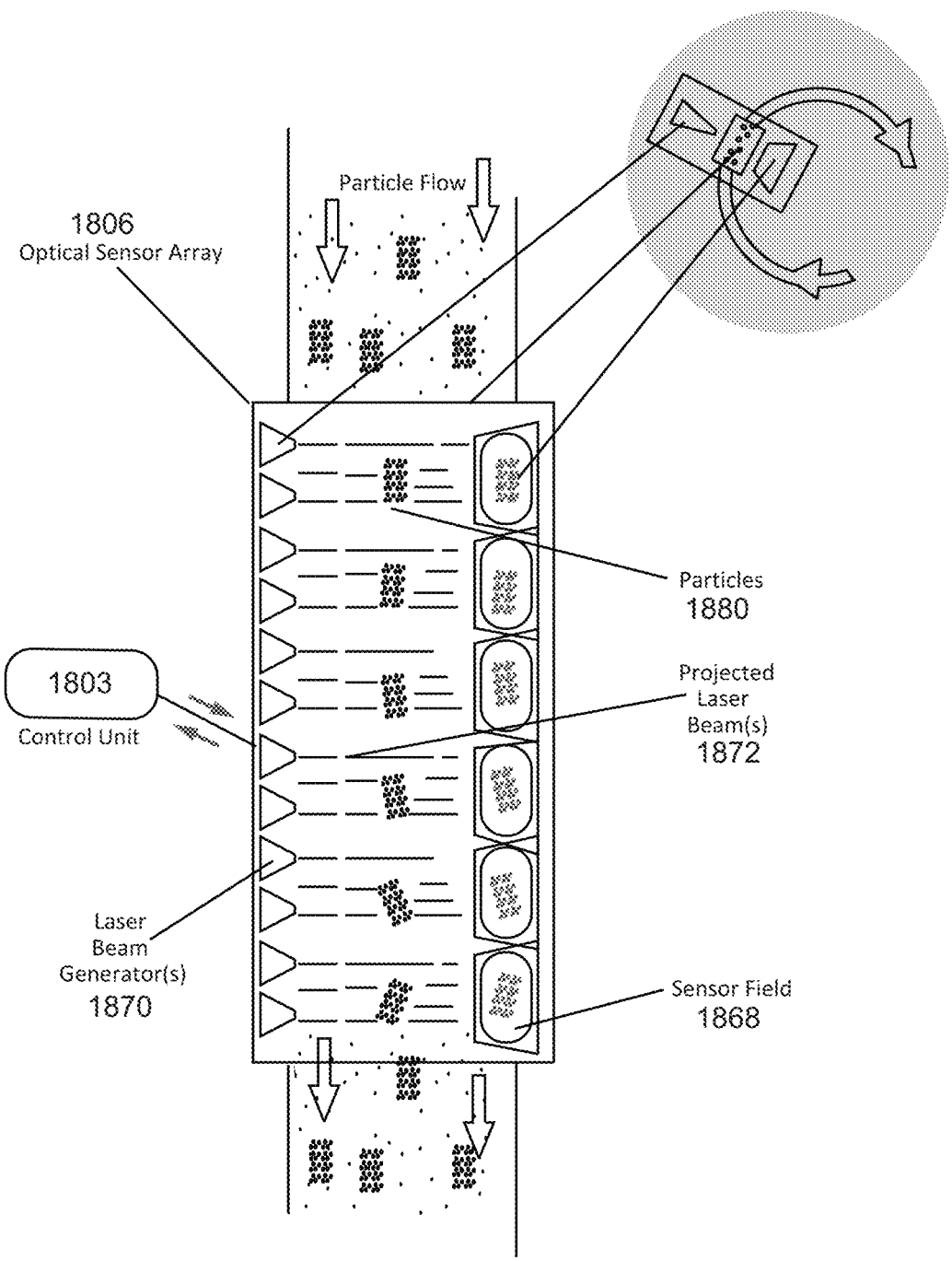
FIG. 18 shows a diagrammatic representation of a particle sampling system, according to an embodiment.

FIG. 18 shows a diagrammatic representation of a particle sampling system, according to an embodiment. The optical sensor array 1806 includes a group of sensors (e.g., deployed in a sensor field 1868) that collect light from a group of opposing light sources (e.g., laser beam generators 1870). The sensors (e.g., electro-optical sensors 1870) can convert light (e.g., projected laser beams 1872) into an electronic signal. Electrical signals from the sensors of the optical sensor array can be transmitted to a computing device (e.g., control unit 1803). An absence of light detected by a sensor among the group of sensors can be determined to be obstructed by a particle. Adjacent sensors having a absence of detected light can be used to determine a size of a particle and/or a shape of a particle. For example, data indicative of a distance between adjacent sensors (e.g., a distance of 8 nm) can be stored in a database accessible to control unit 1803. Based on the data indicative of the distance between adjacent sensors and the identified sensors having an absence of light at a moment in time, the control unit 1803 can determine a size of a particle.

Figure 19:
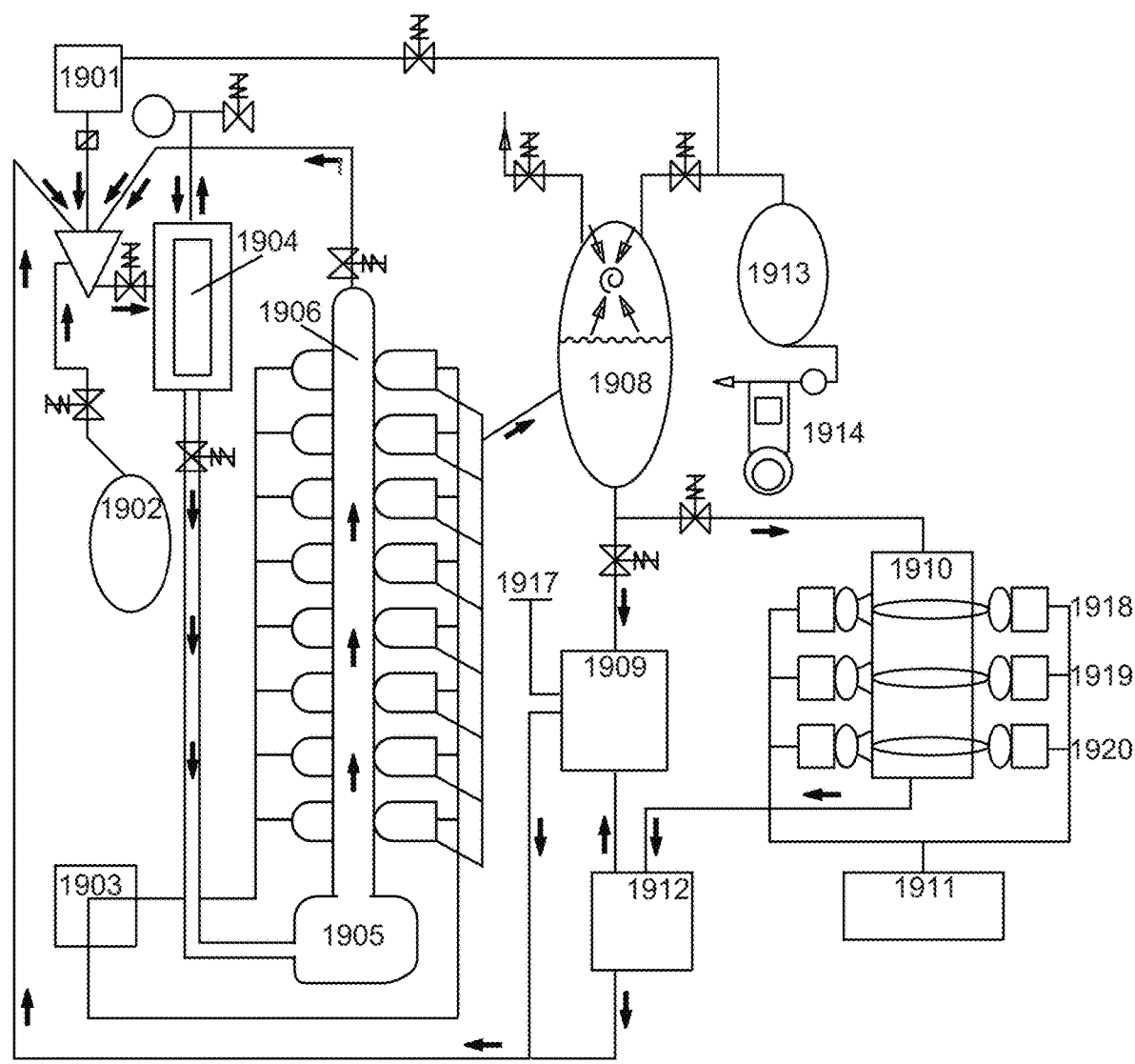
FIG. 19 shows a diagrammatic representation of a primary product line within which nanoparticles can be formed, according to an embodiment.

FIG. 19 shows a diagrammatic representation of a primary product line within which nanoparticles can be formed, according to an embodiment. Material can be input into a material input hopper 1901. Input material can be routed into nanomill core 1904. An atmospheric control unit 1902 can manage, for example, a temperature, pressure, composition, or any combination thereof within the nanomill core 1904.

A portion of the material in the nanomill core 1904 can be recycled back into the nanomill core 1904. Another portion of material in the nanomill core 1904 can be directed to a particle sampling system 1906. A blower 1905 can be used to cause material to flow from the nanomill core 1904 to the particle sampling system 1906. The particle sampling system 1906 can include an optical sensor array, particle sampling array, and a particle separator 1908. Control unit 1903 can manage components (e.g., any of the optical sensor array, the particle sampling array, and the particle separator array) of the particle sampling system 1906.

Material directed through the particle sampling system 1906 can be directed to the nanomill core 1904, a solidifying chamber, a storage chamber, the particle separator 1908 (e.g., a membrane), and/or a particle programming array 1910. Particle separator 1908 can be used to filter and separate constituents of a material. Portions of material (e.g., particles exceeding a particular size threshold) can be returned to material input hopper 1901 to cycle through the nanomill core 1904 again. For example, blower 1913 can utilize compressor 1914 to direct the portions of material toward material input hopper 1901. Other portions of material (e.g., particles under the particular size threshold) can be directed to a particle storage unit 1909 and/or the particle programming array 1910. For example, a blower powered by a compressor can direct the material toward the particle storage unit 1909 and/or the particle programming array 1910.

Particle programming array 1910 can include an ultrasound generator 1918, a magnetic field generator 1919, and a high voltage frequency generator 1920. Control unit 1911 can manage components (e.g., an ultrasound generator 1918, a magnetic field generator 1919, and a high voltage frequency generator 1920) of the particle programming array. Various embodiments of a particle programming array are discussed further below with reference to FIG. 21. Particles exiting the particle programming array 1910 can be directed to particle solidifying chamber 1912.

In an embodiment, particles solidified in particle solidifying chamber 1912 can be packaged or integrated into a product. In another embodiment, particles solidified in particle solidifying chamber 1912 can be further processed.

Figure 20:
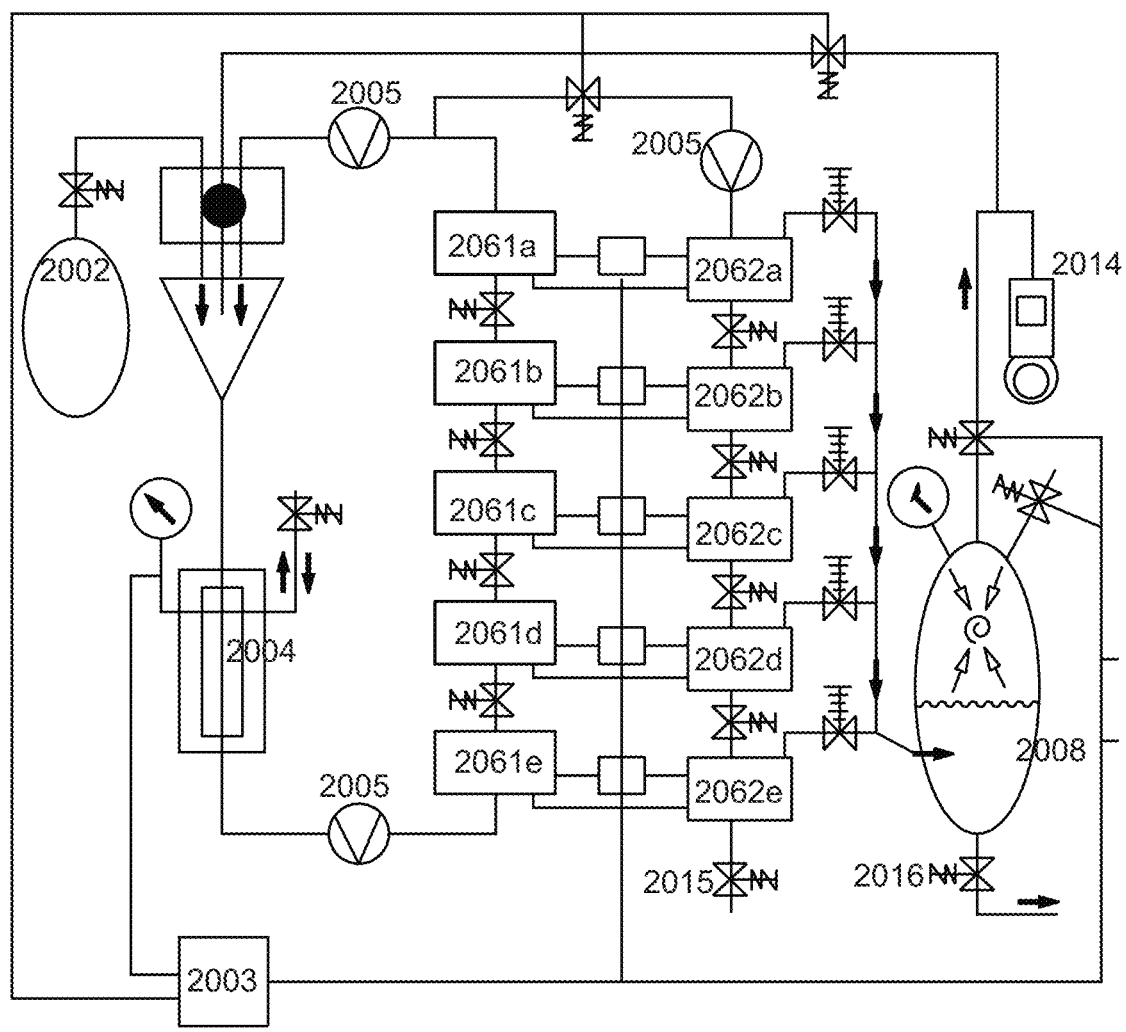
FIG. 20 shows a diagrammatic representation of a nanoparticle sampling line that can operate in parallel with the primary product line, according to an embodiment.

FIG. 20 shows a diagrammatic representation of a nanoparticle sampling line that can operate in parallel with the primary product line, according to an embodiment. A portion of material from the nanomill core 2004 can be directed to the particle sampling system 2006. A blower 2005 can be used to cause material to flow from the nanomill core 2004 to the particle sampling system 2006. The particle sampling system 2006 can include an optical sensor array (e.g., including optical sensors 2061a-e), particle sampling array (e.g., including particle sampler 2062a-e), and a particle separator 2008. Control unit 2003 can manage components (e.g., any of the optical sensor array, the particle sampling array, and the particle separator array) of the particle sampling system 2006. Control unit 2003 can manage one or more valves 2015 to control flow of particles through the particle sampling system 2006. Valves 2015 can be positioned between any of the components as shown in FIG. 20. One or more blowers 2005 can be positioned between any of the components as shown in FIG. 20.

Material directed through the particle sampling system 2006 can be directed to the nanomill core 2004, a solidifying chamber, a storage chamber, and/or a particle programming array 2010. Particle separator 2008 can be used to filter and separate constituents of a material. Portions of material (e.g., particles exceeding a particular size threshold) can be returned to material input hopper 2001 to cycle through the nanomill core 2004 again. For example, a compressor 2014 can direct the portions of material toward the nanomill core 2004. Other portions of material (e.g., particles under the particular size threshold) can be directed to a particle storage unit 2009 and/or the particle programming array 2010. For example, a blower powered by a compressor can direct the material toward the particle storage unit 2009 and/or the particle programming array 2010. Other portions of material can be released through a sampling valve 2016, for example, for further testing and/or to be routed to other components in the system.

Figure 21:
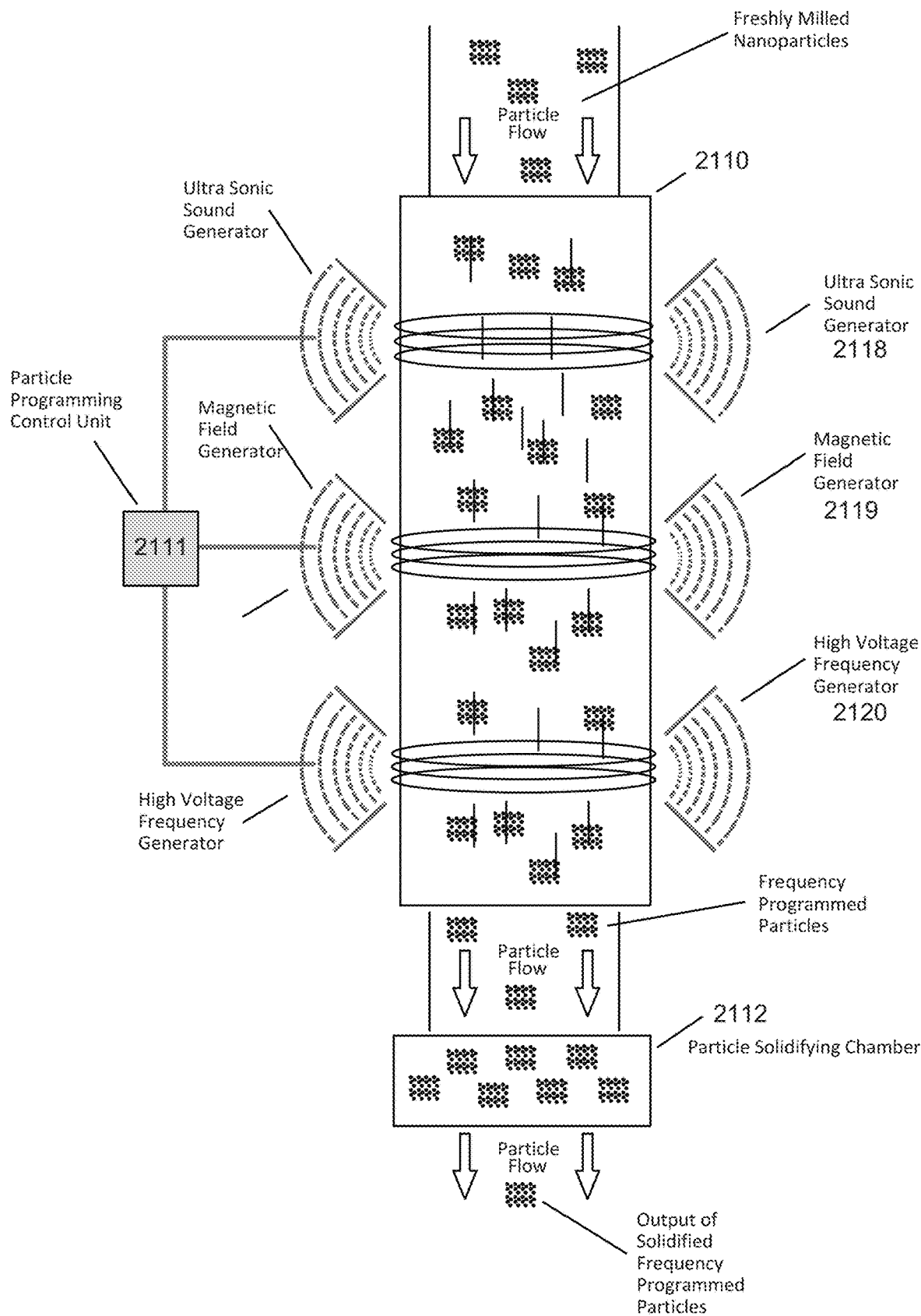
FIG. 21 shows a diagrammatic representation of a particle programming array, according to an embodiment.

FIG. 21 shows a diagrammatic representation of a particle programming array 2110, according to an embodiment. The particle programming array 2110 can include an ultrasound generator 2118, a magnetic field generator 2119, and a high voltage frequency generator 2120. Control unit 2111 can manage various components (e.g., an ultrasound generator 1918, a magnetic field generator 1919, and a high voltage frequency generator 1920) of the particle programming array 2110.

The shape of the nanoparticles produced by the nanomill core can be chaotic and not structurally organized. Increasing the electron charge potential can be achieved by crashing particles into nano sizes. The electrical potential and the zeta potential can be changed to reprogram the particles.

Immediately after crushing the material down to nanoparticles, the crystal lattice is soft for a brief time until it hardens, depending on the material. This is important for the processing the crystal lattice structure of the nanomaterials and changing their physical behavior.

The process can include applying a pulsating magnetic field based on a calculated algorithm from an adjustable frequency generator with a modulated pulse where the shape of the signal is adjusted through a signal generator.

The process can include applying sound waves have a frequency and decibel level based on a material type and size. The material retains the structural changes as it hardens.

When two or more materials that have been treated this way and their frequency adjusted to specifications, a resonance frequency inside of the crystal structure lattice of the material is created. The material remembers this resonance frequency and when one or more materials are stacked, an interaction in the form of released electrons due to the instability of the designed frequencies. The material has a tendency to reach equilibrium and since each of the materials has a different frequency, they are constantly exchanging electrons.

The particle programming array can be equipped with an ultra sonic sound generator which is applied to the soft newly milled material to influence its crystal lattice as it hardens. The particle programming array can be equipped with an magnetic pulse generator which is applied to the soft newly milled material to influence its crystal lattice as it hardens. The particle programming array can be equipped with an high voltage generator which is applied to the soft newly milled material to influence its crystal lattice as it hardens.

The application of the three intrusive forces (e.g., sound, voltage, and magnetic pulse) interfere with the hardening process, influencing the form of the materials and manipulating their crystal lattice frequency. An exit point of the particle programming array can lead to a particle solidifying chamber where the particles are left to harden and bond.

Absorption of ultrasound in nano-composite materials during the application of external magnetic field is considered in this interaction of acoustic waves with crystal lattices of given material, and it depends on many factors such as the type of the crystal lattice, meaning the sum of physical characteristics of the bonds inside the crystal lattice of given material, and those would be temperature, frequency, elasticity of lattice, and its sound absorbing properties. For measurement and calculation of the coefficient of ultrasound absorption it is necessary to estimate the interaction of acoustic phonons with thermal phonons and electrons of investigated crystalline material. Application of external magnetic field on given material leads to the appearance of magnons that interact with the crystal lattice. As a result the ratio "acoustic phonon-thermal phonon" and, accordingly, sound absorption quantitatively increase.

Ultrasound (high frequency acoustic wave) absorption in the crystal lattices occurs as result of phonon interactions and electron-phonon interactions.

In the first case, acoustic phonon interacts with thermal phonon of lattice oscillations of the crystal lattice. Sound absorption coefficient depends on the rate of decrease of the phonons of sound mode in the collision of acoustic and thermal phonons. During such interaction acoustic phonon disappears and third phonon is formed.

In the second case, acoustic phonon is absorbed by free electron. Electron-phonon interactions take place in the crystal lattices of metals. For the latter phonon-phonon interactions also cannot be excluded.

Investigations showed that sound absorption has a different nature for the crystal lattices of dielectrics and metals. From the calculation of coefficient of ultrasound absorption in the crystal lattice based on the phonon theory it follows that the coefficient of ultrasound absorption depends on the energy of the acoustic phonon, on the number of thermal phonons of lattice vibrations, on the temperature and the type of crystal lattice. It was found that increase in temperature and type of crystal lattice appreciably affect ultrasound absorption.

Nano-composite materials are dependent on the temperature of the crystal lattice of nanoparticles. Sound absorbing properties of the nanoparticles can be controlled by changing or manipulating their composition. Application of an alternating magnetic field on nano-composite material leads to an additional increase in ultrasound absorption. A change in the composition of nanoparticles can in turn affect their magnetic properties, such as magnetic viscosity.

Measurement of velocity of bulk acoustic waves on Nano-composite materials showed that applying an external magnetic field decreased the speed of applied acoustic waves. An increase in velocity of acoustic wave causes increase in sound absorption of given material. Application of an external magnetic field (on magnetic field dependent materials) changes their acoustic characteristics, including the material sound absorbing properties.

Quanta of magnetic energy (magnons) absorbed in the investigated material increase the vibrational heat energy of crystal lattice and, consequently, the number of thermal phonons. This, in turn, influences further interaction of acoustic phonons with thermal phonons, and an increase in sound absorption. Obtained results confirm an increase in velocity of the acoustic wave with frequency of sound and with increase in the amount of external magnetic field.

An application of a pulsing magnetic field on given nanomaterial makes the crystal lattice pliable for manipulation by exposing the material to high frequency acoustic waves.

Using a given nanoparticle, the process described above does can affect the nanoparticle as a whole. It does not matter if the nanoparticle is monolith or composite (i.e. synthesized). It is natural for the crystal lattice (i.e. the behavior of the sum of its bonds) to balance out outside influences (in this case the application of a high frequency acoustic wave) until it reaches a state of stability (equilibrium).

Application of a high frequency acoustic wave to a given material is used to modulate the vibration of the bonds inside its crystal lattice (which in turn can result with and be used for the purpose of changing the architecture of the crystal lattice of given material), but each materials crystal lattices bonds have a different spectrum of tolerance to vibrations that they can attain. This scale is linear—there is a highest and a lowest point on the numerical hertz scale that the bonds inside a given material can vibrate at before it breaks, the breakage occurring when either the upper or lower limit has been passed. For this reason different materials (nanoparticles of different chemical compositions) are used as carriers for different "information" (i.e. information meaning a specific frequency at which to modulate a material).

Various applications for formed nanoparticles are contemplated. For example, nanoparticles formed by the process described herein can be used in an electrochemical cell. Embodiments of various applications are described below.

Embodiments include forming an electrochemical cell using a nanoparticle-polymer mixture. Nanoparticles can be mixed with conductive polymers to forms the nanoparticle-polymer mixture. The nanoparticle-polymer mixture may be applied to a porous material (e.g., paper or cloth). Porous material loaded with the nanoparticle-polymer mixture can be rolled to form a battery cell or contoured to form various shapes. The electrochemical cell including nanoparticles may have a low-toxicity due to reduced dependence on certain chemical formulations common in conventional electrochemical cells. The electrochemical cell including nanoparticles may be safer for consumers and more environmentally-friendly than conventional electrochemical cells.

Embodiments include incorporating nanoparticles in an electrochemical cell. Nanoparticles can be included in a primary and/or secondary battery cell. Improved batteries with nanomaterial ingredients last longer and take less time to charge and recharge as reduction—oxidation reaction is amplified (when applicable) with the increased surface of the chemical species.

Embodiments include a shape molding method to form an electrochemical cell designed for incorporation into a product (referred to as a "unibody battery"). The unibody battery can be formed, for example, as a structural component of a product or into any shape for use in a product. A unibody battery designed as a part of the structure can be, for example, three-dimensionally ("3D") printed into a structural shape. The unibody battery can be used as a structural component, for example, in a vehicle (e.g., chassis of a car, airplane, ship, drone, satellite, etc.) or a building (e.g., a cinder block, load-bearing beam, floor tile, etc.). The concept includes 3D printing a variety of building materials in, for example, residential, commercial, and industrial building construction. Unibody batteries can include mixing nanomaterials into the frame or fuselage of the vehicle or device which is powered by the battery. A unibody battery can be formed into any shape including, for example, stacked layers of nanomaterials (in resin) designed to form a specific shape. Examples include stacked layers configured to fit into the floor compartment of an electric vehicle, form an enclosure of a cell phone, a frame or step pad of an electric scooter, or roof of a golf cart.

Targeted Nanoparticle Design

Embodiments of the technology disclosed herein include methods to form nanoparticles. Some methods of forming nanoparticles include manufacturing nanoparticles on an industrial scale for a variety of applications. Nanoparticles can include a tailor-made design targeted for one or more industries. Nanoparticles can be formed in a nanomill by an aerodynamic mechanical milling process capable of high volume manufacturing of monolith and composite nanomaterials for commercial use.

A particle exiting the nanomill process is in a raw state and prepared to be "manipulated" or left to harden into its natural state. At the point of exiting the nanomill, there is a time window to design (i.e., program) the particle before it hardens and prevent the particle to come to its natural state. One purpose of the technology described herein is to take advantage of the circumstances created by the nanomill and modify or manipulate expected particle behavior in a real-time environment. The variations of said behavior are subject to a wide degree of freedom within the scope of manipulating the material.

When two or more materials that have been treated this way and the particle frequency is adjusted to specifications, a resonance frequency inside of the crystal structure lattice of the material can be created, modified, and controlled.

The material remembers this resonance frequency and when one or more materials are stacked, an interaction in the form of released electrons due to the instability of the designed frequencies occurs. Particle memory can be explained as an "intelligent reaction" by a 'clever' or "informed" entity.

Different resonant frequencies of particles cause desired (electrostatic) instabilities.

The raw material has a tendency to reach equilibrium and since each of the materials that are interacting has a different frequency, they are constantly exchanging electrons.

When there are two or more materials to be synthesized by an entity to form a new kind of composite material, the following must be taken into account: First, the entity needs to program each of them, assign them polarity and an electron assembly difference to get them together. This means their electron compositions need to be somehow compatible to attract each other and merge. This also means the materials can reach a composite stage without applying glue (e.g. epoxy), a polymer, or any other kind of chemical connection.

When the entity makes a new kind of composite material and tries to make the materials reach a new state of equilibrium between a plurality of the same or different kinds of materials, there must be at least four materials in composition. Out of those four, two can be the bonding materials or clustering materials and can thus be separately programmed.

When the entity has a material composition comprising one basic element, such as aluminum, that has been programmed in two different configurations, the entity can build specific clusters that can act as unstable or extraordinarily stable clusters.

By applying two different versions of the same chemical element (in this case, aluminum) with a semiconducting material placed between them, the entity will have a composition which will generate energy out of its own unstable stage. We can say the resonance inside the material is the activator extracting energy out of the surrounding because of the material's constant tendency to reach a dynamical balance in its own surrounding.

The technology disclosed herein is an integral part of the nanomill manufacturing process of forming monolith nanoparticles and synthetic (composite) nanoparticles—as well as being a technology that can be utilized independently of the nanomill using particles that have been processed and procured with other methods not dependant on said prior art. In the process of nanoparticle-programming materials, particles are being subjected to one or more "disruptions" to their natural state consisting of X, Y, Z, etc.

Embodiments of the technology disclosed herein include methods to form nanoparticle materials which can be "informed" and their equilibrium manipulated, i.e. methods which enable us to control their potential behavior by the process of frequency programming or reprogramming their crystal lattice, or by methods where we do not interfere with their natural process of hardening after the disruption caused by the milling process, a non-interference which will enable the particles to settle into their natural state.

Embodiments of the technology disclosed herein include methods to program nanoparticle materials subjected to one or more controlling "disruptions" including: (1) Voltage Method, (2) Sound Method (White Noise), (3) Magnetic Method, and (4) Light. Embodiments of the technology disclosed herein include using Methods 1, 2, 3 and 4 one at a time in any order, once or repeatedly, or two or more methods consecutively, simultaneously in tandem, or randomly with the purpose of manipulating the material resonant frequency.

Embodiments of the technology disclosed herein include taking into account the inherent structural details and arrangement of the materials before processing, i.e. register the initial state of the material which then becomes our reference point referring to the nanoparticle end product.

Embodiments of the technology disclosed herein include exposing the materials to an ultrasonic generator throughout the milling process in order to keep the particles soft. The process is designed to apply sound generated vibrations on the outer and inner walls, enclosures and transport tunnels that comprise the nanomill production parts and pipeline from particle entry point to particle exit point. The purpose is to prevent the particles from being clustered with one another at any given time in the process, or in any way connected to each other, or connected to the inner surface areas of the nanomill in its entirety both before, during and after the process of colliding against each other inside the nanomill core.

Embodiments of the technology disclosed herein include exposing the materials ultrasonic generator after the milling process is concluded, including before programming the particles by the four methods, and including the point at which particle programming is concluded.

Embodiments of the technology disclosed herein include applying voltage to the particles at any point during the milling process including the end point and points of merging two or more nanoparticles during milling in the case of said method being used in a nanomill configuration such as a nanomill farm. This method is called the "Voltage Method."

Embodiments of the technology disclosed herein include applying high potential voltage frequency in order to instigate a potential discharge in particle surface. This imposed discharge is defined as electric polarity of particles, where the polarity is one of the factors that enables two or more particles, consisting of the same or different material, to be attracted to each other.

Embodiments of the technology disclosed herein include a method to modulate particle electric potential with adjustable high pulsing voltage and adjustable frequency.

Embodiments of the technology disclosed include applying modulated voltage and frequency calculated and adjusted for different types of material. The method takes into calculation the basic potential of material and electron configurations, depending on what materials are being processed at each time.

Embodiments of the technology disclosed herein include methods to manipulate materials with a higher than average density. The voltage method can be applied by plasma discharge to modify the basic potential energy of material. By this procedure of plasma discharge into the material housing we are relocating the existing energy inside of the material as quickly as possible and without loss of energy.

Embodiments of the technology disclosed herein include methods of placing the materials inside a sealed chamber for uninterrupted exposure to the forces described in Methods 1, 2, 3, and 4 and extraction of said chamber. The chamber may be 100% sound proof, temperature controlled, atmosphere controlled, etc.

Embodiments of the technology disclosed herein include methods preventing energy loss from the chamber while housing the material as the process is conducted, thus eliminating heat exposure and other influences that can contribute to such a loss.

Embodiments of the technology disclosed herein included in the Voltage Method take into account the electron spin when adjusting the particle frequency. The applied voltage has to be adapted and adjusted to accommodate the electric potential of the material in question.

Embodiments of the technology disclosed herein include adding additional energy to the electron spin by attributing frequency adjusted modulated energy to the orbital of the material. In this process we reconfigure an electron orbital from its basic state to a desired state in order to change its basic behavior of the targeted material. By applying this process, parameters can be changed such as the potential charge of the material, polarity, energy density, mass, resistance and conductivity, material strength, elasticity, etc.

Embodiments of the technology disclosed herein include changing the electron spin or the orbital of the atom, by which the state of the matter has been changed without affecting the core of the atom. The change in the particle charge enables the increase or decrease of the potential energy of the material, for example, in basic materials used in battery building technology when an entity wants to influence the potential charge ability.

Embodiments of the technology disclosed herein include applying sound (e.g. white noise) to the particles at any point during the milling process including the end point and points of merging two or more nanoparticles during milling in the case of said method being used in a nanomill configuration such as a nanomill farm. This method is called the Sound Method.

Sound, aside from the Sound Method embodiment of the technology disclosed herein, is a basic type of signal applied in some degree in all steps of particle programming where it is modulated, adjusted and augmented before, during or after particular steps of the process, see article above referring to sound application throughout the milling process.

Embodiments of the technology disclosed herein include methods how to apply white noise (WN) to disrupt the particles before and/or during the hardening process after milling is concluded. WN has a constant power spectral density which means that the power of emitted sound doesn't change with frequency of the sound inside the spectrum and it contains the widest possible frequency ranges (or bandwidth) and is therefore useful for disrupting the hardening process and manipulating the particle frequency.

Embodiments of the technology disclosed herein include methods applying WN to instigate changes at the crystal lattice level during hardening so they manifest in the material at the end of the programming process.

Embodiments of the technology disclosed herein include methods of how to conduct particle programming, i.e. to structure a particle at the crystal lattice level, the particle syntax may be asserted in its natural state to subsequently alter it to suit our purpose.

Embodiments of the technology disclosed herein include methods how to manipulate the basic structure of a material and determine the viable change that can be expected from the material after reprogramming its structure at nanolevel. The structural details and arrangement, i.e. the initial state of the material, is our reference point before the changes at the crystal level are manifested as the end result of the particle programming process.

Embodiments of the technology disclosed herein include methods realizing the reference point and observing the changes during the process requires an integrated monitoring and sampling process.

Embodiments of the technology disclosed herein include a particle programming chamber that is multilayered in its construction with at least 7 layers, some of which comprise aluminum foil and sonic insulators. Inside of this multilayer chamber is an inner component, or box, made of cast iron segments specially geometrically designed to avoid echo and other reverb interruptions.

Embodiments of the technology disclosed herein include methods where WN is applied inside the particle programming chamber. The chamber can be compared to a Faraday casing, as it is insulated from everything, has grounding, and occupies a magnetic field factor.

Embodiments of the technology disclosed herein include methods applied inside and outside the inner component of the chamber where we have an arrangement of sound receivers and sound projectors. Each of these is placed in one of the 4 corners of the inner chamber component according to a geometrical arrangement, with a sampler focal point in the middle, where the particles are placed during the process.

Embodiments of the technology disclosed herein include the chamber and its components being able to create a vacuum, omit light, sound, physical vibrations, and any external interference during the process, so as not to influence or disrupt one or any of the four methods applied at a given time.

Embodiments of the technology disclosed herein include physical elements strategically placed inside the chamber where a reference point for evaluating changes in the material during sampling has been defined. As the material is stationary and confined during the process, an entity can apply one or more of said physical elements (in this case WN receivers). For example, when WN is applied to the material in any sequence, once, twice, or repeatedly, until there are at least 3 identical reference point readouts from the receivers providing information made available in the scan.

Embodiments of the technology disclosed herein include projecting WN for a millisecond from the four corner projectors inside the inner chamber. The receivers will absorb the WN for a millisecond at the opposite corners of the chamber, thus creating a map of sounds absorbed or lagged as it passes through the material.

Embodiments of the technology disclosed herein include methods of sampling the WN and determining the absorption or lag in order to read the sound signature of the material.

Embodiments of the technology disclosed herein include methods to read and duplicate a WN sound signature of a particular material for the purpose of retransmitting it into a second material, thus imprinting an imprint of the first material and changing its parameters and frequency. For clarification, presume all but 12 types of sound are unaffected when applied to the first material, suggesting that we define the WN as lacking 12 types of sound. Thus, we have created a formula to influence the second material by applying WN minus these same 12 types of sound to assimilate it with the first material.

Embodiments of the technology disclosed herein include methods of projecting WN into the material according to an algorithm, e.g. WN applied sporadically, or in intervals with a measured time of silence, or any other sequence including forming a pattern or rhythm applicable to the material in question to reach a desired outcome.

Embodiments of the technology disclosed herein include applying magnetic forces to the particles at any point during the milling process including the end point and points of merging two or more nanoparticles during milling in the case of said method being used in a nanomill configuration such as a nanomill farm. This method is called the Magnetic Method.

Embodiments of the technology disclosed herein include applying light (e.g., with a laser) to the particles at any point during the milling process including the end point and points of merging two or more nanoparticles during milling in the case of said method being used in a nanomill configuration such as a nanomill farm. This method is called the Light Method.

By applying light, the technology can affect the particle hardening process and measuring indirectly the particle size distribution through measurements of light scattering intensity depending on the scattering angle and the wavelength of light. Once the experimental setup (instrument) is arranged, there is no need for scaling or calibration. There are a lot of advantages of this method: fast operation, ease of use, high reproducibility, broad dynamic size range (e.g., from nanometers to millimeters). Today, the term "laser diffraction" doesn't reflect in full measure the current state of the art in technology.

This method uses a light source that generates a monochromatic beam. After passing through several optical elements, the beam is modified to a collimated beam having a smooth radial intensity distribution which illuminates the particles in the scattering volume. The particles scatter light that gives unique angular scattering patterns. These patterns are then Fourier analyzed and transformed into a spatial intensity pattern which is detected by properly designed photodetectors. These photodetectors generate the photocurrent that is subsequently processed and digitized creating an intensity flux pattern. The particle size distribution is result of computer data analysis that converts the set of flux values into the measurement data.

The scattered light intensity of a particle detected at a fixed distance by a unit area of detection depends on particle dimension and shape, the refractive index ratio between the particle and medium, the wavelength and polarization of light, and scattering angle. Scattering intensity from a sample (or an ensemble of measured particles) depends on particle concentration and interaction between them. Variables such as the detection distance, scattering volume, detector area, light wavelength and polarization are constants in any particular experimental setup.

The sample concentration has to be optimized so that the particles scatter with sufficient intensity to enable the measurement to be completed within a desired signal to noise ratio but avoiding saturation of the detecting system. In a laser diffraction measurement, we have to make an assumption that both the density of the particles and the refractive index in the sample are uniform, which is true in most cases. In such a case the scattered light intensity depends only on particle shape, particle size, and scattering angle. Knowing the relations between the scattering intensity, scattering angle, and particle size and shape, the particle size and shape can be obtained (at least theoretically, based on a model of the scattering process) through measurements of the angular scattering pattern. There are no simple interpretations of the scattering patterns of irregularly shaped particles.

For the particles less than 200 nm, maximum intensity contrast is too small to effectively retrieve the correct particle size. It means that for nanoparticles smaller than 200 nm (even by using larger angles and shorter wavelengths), it is still difficult to obtain an accurate size. The actual boundary of measurement procedure changes depending on the relative refractive index between the particle and medium. Thus, there are physical limitations of this method.

For small particles there is a minimum around 90 degrees. that shifts to larger angles for larger particles. The lower sizing limit for this method is roughly 50 nm, using polarization effects in combination with wavelength dependence at large angles. This approach is known as the polarization intensity differential scattering (PIDS) technique. When a nanoparticle that is much smaller than the light wavelength is located in a light beam, the oscillating electric field of the light induces an oscillating dipole moment in the particle. This means that the electrons in the atoms of the particle (particle's lattice) oscillate relative to the center of the mass of particle. This oscillation of the electrons is in the direction of oscillation of the electric field component of the light, and therefore perpendicular to the direction of propagation of the light beam. As a result, the oscillating dipole radiates light in all directions except in the direction of oscillation. Therefore, if the detector is facing the direction of oscillation it will receive no scattering from single dipoles. When the light beam is polarized in either the vertical direction or the horizontal direction, the scattering intensity for a given angle will be different.

There are many different designs and constructions of a laser diffraction analyzer regarding the applied optics, electronics, mechanics and the computer software used in the instrument. There are two types of light sources used in laser diffraction analyzers. One is a white light source (e.g., a tungsten-halogen lamp), and the other is a continuous laser light source. The white light source normally has random polarization and a broad spectral range with wavelengths typically ranging from 250 nm to 3000 nm. It can be used when multi-wavelength measurements are required. By placing filters of different wavelength and polarizers in the beam path before the sample chamber, we can make diffraction measurements at selected wavelengths and different polarizations.

Laser light has many advantages such as long lifetime, the high degree of stability, monochromatic illumination, and long spatial and temporal coherence. The light beam from a He—Ne laser is circular with radial symmetry and is collimated with small divergence. A He—Ne laser produces stable mono-chromic light and can have an expected life in excess of 20,000 hours. Advancements in semiconductors and fiber optics have allowed diode lasers to replace both gas and ion lasers because of their low cost (often only one tenth of a gas laser), long lifetimes, low operating voltage, and compactness (e.g., a 500 mm3 package can house a 200 mW single-mode laser). However, the light from a diode laser is neither collimated nor radially symmetric, and it has severe astigmatism (the divergence of light at two perpendicular directions is different). Therefore, when using a diode laser in diffraction analyzer setup, a set of optical components is needed to perform divergence correction, asymmetry correction and astigmatic correction in order to obtain a collimated circular beam. These tasks can be achieved in a compact manner and some of the optical components have been integrated in commercially available packaged diode lasers. By concentrating primarily on the laser method for measuring dimension or sliding the shape as well as for particle reshaping because of possibility, an entity can much better moderate laser wave through the intensity, power, shape, pulse, and power to modulate the oscillation and control within the needed time frame.

Terminology

Brief definitions of terms, abbreviations, and phrases used throughout this application are given below.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described that may be exhibited by some embodiments and not by others. Similarly, various requirements are described that may be requirements for some embodiments but not others.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements. The coupling or connection between the elements can be physical, logical, or a combination thereof. For example, two devices may be coupled directly, or via one or more intermediary channels or devices. As another example, devices may be coupled in such a way that information can be passed there between, while not sharing any physical connection with one another. Additionally, the words "herein," "above," "below," and words of similar import, when used in this application, shall refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list.

If the specification states a component or feature "may," "can," "could," or "might" be included or have a characteristic, that particular component or feature is not required to be included or have the characteristic.

The term "module" refers broadly to software, hardware, or firmware components (or any combination thereof). Modules are typically functional components that can generate useful data or another output using specified input(s). A module may or may not be self-contained. An application program (also called an "application") may include one or more modules, or a module may include one or more application programs.

The terminology used in the Detailed Description is intended to be interpreted in its broadest reasonable manner, even though it is being used in conjunction with certain examples. The terms used in this specification generally have their ordinary meanings in the art, within the context of the disclosure, and in the specific context where each term is used. For convenience, certain terms may be highlighted, for example using capitalization, italics, and/or quotation marks. The use of highlighting has no influence on the scope and meaning of a term; the scope and meaning of a term is the same, in the same context, whether or not it is highlighted. It will be appreciated that the same element can be described in more than one way.

Consequently, alternative language and synonyms may be used for any one or more of the terms discussed herein, but special significance is not to be placed upon whether or not a term is elaborated or discussed herein. A recital of one or more synonyms does not exclude the use of other synonyms. The use of examples anywhere in this specification, including examples of any terms discussed herein, is illustrative only and is not intended to further limit the scope and meaning of the disclosure or of any exemplified term. Likewise, the disclosure is not limited to various embodiments given in this specification.

Computer

Figure 22:
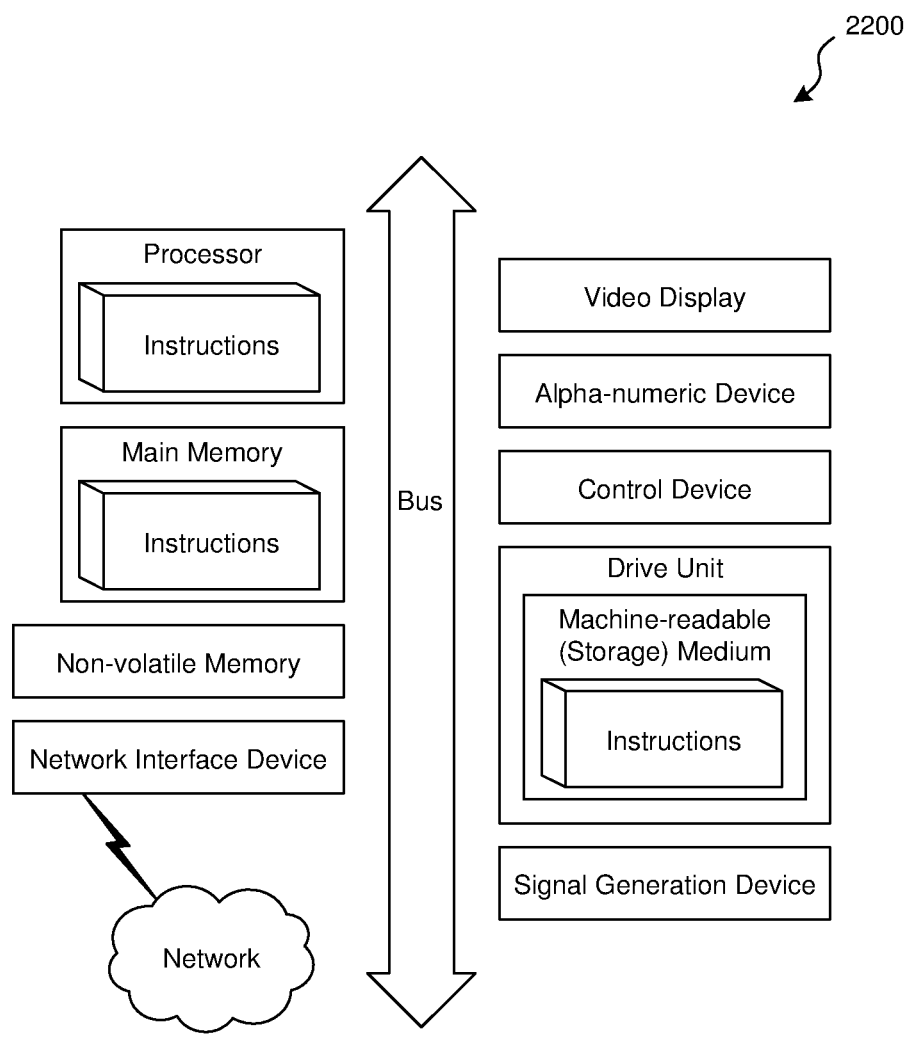
FIG. 22 is a diagrammatic representation of a machine in the example form of a computer system within which a set of instructions, for causing the machine to perform any one or more of the methodologies or modules discussed herein, can be executed.

FIG. 22 is a diagrammatic representation of a machine in the example form of a computer system 2200 within which a set of instructions, for causing the machine to perform any one or more of the methodologies or modules discussed herein, can be executed.

In the example of FIG. 22, the computer system 2200 includes a processor, memory, non-volatile memory, and an interface device. Various common components (e.g., cache memory) are omitted for illustrative simplicity. The computer system 2200 is intended to illustrate a hardware device on which any of the components described in the example of FIGS. 1-24 (and any other components described in this specification) can be implemented. The computer system 2200 can be of any applicable known or convenient type. The components of the computer system 2200 can be coupled together via a bus or through some other known or convenient device.

This disclosure contemplates the computer system 2200 taking any suitable physical form. As example and not by way of limitation, computer system 2200 can be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 2200 can include one or more computer systems 2200; be unitary or distributed; span multiple locations; span multiple machines; or reside in a cloud, which can include one or more cloud components in one or more networks. Where appropriate, one or more computer systems 2200 can perform without substantial spatial or temporal limitation one or more steps of one or more methods described or illustrated herein. As an example and not by way of limitation, one or more computer systems 2200 can perform in real time or in batch mode one or more steps of one or more methods described or illustrated herein. One or more computer systems 2200 can perform at different times or at different locations one or more steps of one or more methods described or illustrated herein, where appropriate.

The processor can be, for example, a conventional microprocessor such as an Intel Pentium microprocessor or Motorola PowerPC microprocessor. One of skill in the relevant art can recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer system 2200. The non-volatile storage can be local, remote, or distributed. The non-volatile memory is optional because systems can be created with all applicable data available in memory. A typical computer system can usually include at least a processor, memory, and a device (e.g., a bus) coupling the memory to the processor.

Software is typically stored in the non-volatile memory and/or the drive unit. Indeed, storing an entire large program in memory may not be possible. Nevertheless, it should be understood that for software to run, if necessary, it is moved to a computer readable location appropriate for processing, and for illustrative purposes, that location is referred to as the memory in this paper. Even when software is moved to the memory for execution, the processor can typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium." A processor is considered to be "configured to execute a program" when at least one value associated with the program is stored in a register readable by the processor.

The bus also couples the processor to the network interface device. The interface can include one or more of a modem or network interface. It can be appreciated that a modem or network interface can be considered to be part of the computer system 2200. The interface can include an analog modem, ISDN modem, cable modem, token ring interface, satellite transmission interface (e.g., "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted in the example of FIG. 22 reside in the interface.

In operation, the computer system 2200 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux™ operating system and its associated file management system. The file management system is typically stored in the non-volatile memory and/or drive unit and causes the processor to execute the various acts utilized by the operating system to input and output data and to store data in the memory, including storing files on the non-volatile memory and/or drive unit.

Some portions of the detailed description can be presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms and displays presented herein are not inherently related to any particular computer or other apparatus. Various general purpose systems can be used with programs in accordance with the teachings herein, or it can prove convenient to construct more specialized apparatus to perform the methods of some embodiments. The utilized structure for a variety of these systems can appear from the description below. In addition, the techniques are not described with reference to any particular programming language, and various embodiments can thus be implemented using a variety of programming languages.

In alternative embodiments, the machine operates as a standalone device or can be connected (e.g., networked) to other machines. In a networked deployment, the machine can operate in the capacity of a server or a client machine in a client-server network environment, or as a peer machine in a peer-to-peer (or distributed) network environment.

The machine can be a server computer, a client computer, a personal computer (PC), a tablet PC, a laptop computer, a set-top box (STB), a personal digital assistant (PDA), a cellular telephone, an iPhone, a Blackberry, a processor, a telephone, a web appliance, a network router, switch or bridge, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database, and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies or modules of the presently disclosed technique and innovation.

In general, the routines executed to implement the embodiments of the disclosure, can be implemented as part of an operating system or a specific application, component, program, object, module or sequence of instructions referred to as "computer programs." The computer programs typically comprise one or more instructions set at various times in various memory and storage devices in a computer, and that, when read and executed by one or more processing units or processors in a computer, cause the computer to perform operations to execute elements involving the various aspects of the disclosure.

Moreover, while embodiments have been described in the context of fully functioning computers and computer systems, those skilled in the art can appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

In some circumstances, operation of a memory device, such as a change in state from a binary one to a binary zero or vice-versa, for example, can comprise a transformation, such as a physical transformation. With particular types of memory devices, such a physical transformation can comprise a physical transformation of an article to a different state or thing. For example, but without limitation, for some types of memory devices, a change in state can involve an accumulation and storage of charge or a release of stored charge. Likewise, in other memory devices, a change of state can comprise a physical change or transformation in magnetic orientation or a physical change or transformation in molecular structure, such as from crystalline to amorphous or vice versa. The foregoing is not intended to be an exhaustive list in which a change in state for a binary one to a binary zero or vice-versa in a memory device can comprise a transformation, such as a physical transformation. Rather, the foregoing is intended as illustrative examples.

A storage medium typically can be non-transitory or comprise a non-transitory device. In this context, a non-transitory storage medium can include a device that is tangible, meaning that the device has a concrete physical form, although the device can change its physical state. Thus, for example, non-transitory refers to a device remaining tangible despite this change in state.

Remarks

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling others skilled in the relevant art to understand the claimed subject matter, the various embodiments, and the various modifications that are suited to the particular uses contemplated.

While embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Although the above Detailed Description describes certain embodiments and the best mode contemplated, no matter how detailed the above appears in text, the embodiments can be practiced in many ways. Details of the systems and methods may vary considerably in their implementation details, while still being encompassed by the specification. As noted above, particular terminology used when describing certain features or aspects of various embodiments should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless those terms are explicitly defined herein. Accordingly, the actual scope of the invention encompasses not only the disclosed embodiments, but also all equivalent ways of practicing or implementing the embodiments under the claims.

The language used in the specification has been principally selected for readability and instructional purposes, and it may not have been selected to delineate or circumscribe the inventive subject matter. It is therefore intended that the scope of the invention be limited not by this Detailed Description, but rather by any claims that issue on an application based hereon. Accordingly, the disclosure of various embodiments is intended to be illustrative, but not limiting, of the scope of the embodiments, which is set forth in the following claims.

What is claimed is:

1. A particle programming apparatus, comprising:
an input channel configured to receive nanoparticles from a mill core;
one or more programming devices configured to alter a crystal lattice of the received nanoparticles, the one or more programming devices including any of:
a magnetic pulse generator configured to apply a magnetic pulse to the received nanoparticles; and
a voltage generator configured to apply a voltage to the received nanoparticles; and
a control unit configured to:
determine a time threshold within which to apply the magnetic pulse, the voltage, or the magnetic pulse and the voltage after receiving the nanoparticles from the mill core, the time threshold being based on a solidifying rate associated with a material composition of the received nanoparticles; and
apply the magnetic pulse, the voltage, or the magnetic pulse and the voltage, to the received nanoparticles within the time threshold.

2. The particle programming apparatus of claim 1, wherein applying the magnetic pulse causes the crystal lattice of the received nanoparticles to be pliable for manipulation by application of a sound, the voltage, or the sound and the voltage.

3. The particle programming apparatus of claim 1, wherein the magnetic pulse, the voltage, or the magnetic pulse and the voltage are applied as the received nanoparticles solidify.

4. The particle programming apparatus of claim 1, further comprising:
an output channel configured to deliver programmed nanoparticles to a nanoparticle solidifying chamber.

5. The particle programming apparatus of claim 1, wherein the particle programming apparatus further includes a pre-defined temperature, pressure, and/or atmospheric composition.

6. The particle programming apparatus of claim 1, wherein the time threshold is a maximum time between receiving the nanoparticles from the mill core and applying the magnetic pulse, the voltage, or the magnetic pulse and the voltage.

7. The particle programming apparatus of claim 1, further comprising an ultrasonic sound generator programming device configured to apply a sound to the nanoparticles received from the mill core, wherein the sound is applied to the nanoparticles during the application of the magnetic pulse to the nanoparticles.

8. A product line, comprising:
a mill core;
a particle sampling system connected to the mill core and configured to receive nanoparticles from the mill core;
a particle programming apparatus comprising an input channel connected to the particle sampling system, wherein the particle sampling system is configured to direct the nanoparticles to the particle programming apparatus if the nanoparticles are determined to be below a threshold size;
wherein the particle programming apparatus comprises one or more programming devices configured to alter a crystal lattice of the nanoparticles received from the particle sampling system, the one or more programming devices including a magnetic pulse generator, a voltage generator, or the magnetic pulse generator and the voltage generator;
wherein the one or more programming devices are configured to apply a magnetic pulse, a voltage, or the magnetic pulse and the voltage to the nanoparticles received from the particle sampling system within a time threshold of receiving the nanoparticles from the mill core via the particle sampling system; and further comprising a control unit that determines the time threshold within which to apply the magnetic pulse, the voltage, or the magnetic pulse and the voltage, wherein the time threshold is based on a solidifying rate associated with a material composition of the nanoparticles received from the particle sampling system.

9. The product line of claim 8, wherein applying the magnetic pulse causes the crystal lattice of the nanoparticles received from the particle sampling system to be pliable for manipulation by application of a sound, the voltage, or the sound and the voltage.

10. The product line of claim 8, wherein the nanoparticles received from the particle sampling system are formed by collisions in an impact region between a first aerodynamic vane and a second aerodynamic vane in the mill core.

11. The product line of claim 8, wherein the particle programming apparatus further comprises:
an output channel configured to deliver programmed nanoparticles to a nanoparticle solidifying chamber.

12. The product line of claim 8, wherein the particle programming apparatus further includes a pre-defined temperature, pressure, and/or atmospheric composition.

13. The product line of claim 8, wherein the particle programming apparatus further comprises an ultrasonic sound generator programming device configured to apply a sound to the nanoparticles received from the particle sampling system, wherein the sound is applied to the nanoparticles during the application of the magnetic pulse to the nanoparticles.

14. A method for programming nanoparticles, comprising:
receiving, by a particle programming array, nanoparticles from a mill core within a time threshold of formation of the nanoparticles in the mill core;
applying, by the particle programming array, a magnetic pulse, a voltage, or the magnetic pulse and the voltage to the nanoparticles to alter a crystal lattice structure of the nanoparticles within the time threshold of formation, wherein the time threshold of formation is based on a solidifying rate associated with a material composition of the received nanoparticles; and
directing the nanoparticles to a solidifying chamber such that the nanoparticles solidify with the altered crystal lattice structure.

15. The method of claim 14, wherein the nanoparticles are formed by collisions in an impact region between a first aerodynamic vane and a second aerodynamic vane in the mill core.

16. The method of claim 14, wherein the magnetic pulse is applied prior to or during application of a sound and/or the voltage to increase pliability for alteration by the application of the sound and/or the voltage.

17. The method of claim 14, wherein the application of the magnetic pulse causes the crystal lattice structure to be pliable for manipulation by the application of a sound and/or the voltage.

18. The method of claim 14, wherein the voltage is applied to the nanoparticles as the nanoparticles solidify.

* * * * *